(12) United States Patent
Yang et al.

(10) Patent No.: US 9,425,420 B2
(45) Date of Patent: Aug. 23, 2016

(54) ACTIVE MATERIALS FOR ELECTRO-OPTIC DEVICES AND ELECTRO-OPTIC DEVICES

(75) Inventors: Yang Yang, Los Angeles, CA (US); Letian Dou, Los Angeles, CA (US); Jing-Bi You, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 279 days.

(21) Appl. No.: 14/009,033

(22) PCT Filed: Mar. 29, 2012

(86) PCT No.: PCT/US2012/031265
§ 371 (c)(1),
(2), (4) Date: Sep. 30, 2013

(87) PCT Pub. No.: WO2012/135527
PCT Pub. Date: Oct. 4, 2012

(65) Prior Publication Data
US 2014/0020739 A1    Jan. 23, 2014

Related U.S. Application Data

(60) Provisional application No. 61/468,904, filed on Mar. 29, 2011, provisional application No. 61/500,832, filed on Jun. 24, 2011.

(51) Int. Cl.
*H01L 31/00* (2006.01)
*H01L 51/42* (2006.01)
(Continued)

(52) U.S. Cl.
CPC .......... *H01L 51/4246* (2013.01); *H01L 27/302* (2013.01); *H01L 51/0036* (2013.01); *H01L 51/002* (2013.01); *H01L 51/4253* (2013.01); *H01L 51/441* (2013.01)

(58) Field of Classification Search
CPC ............ H01L 51/4246; H01L 51/4253; H01L 51/0036; H01L 51/0037; H01L 51/002; H01L 51/441; H01L 51/442; H01L 51/4233; Y02E 10/50
USPC .................................... 136/255, 263
See application file for complete search history.

(56) References Cited

U.S. PATENT DOCUMENTS

2008/0092946 A1    4/2008  Munteanu et al.
2009/0126779 A1*   5/2009  Heeger ............... B82Y 10/00
                                                 136/249
(Continued)

FOREIGN PATENT DOCUMENTS

JP    2010-272674 A    12/2010
JP    2010-537418 A    12/2010
(Continued)

OTHER PUBLICATIONS

Puetz et al., "Organic solar cells incorporating buffer layers from indium doped zinc oxide nanoparticles," Solar Energy Materials and Solar Cells, 2010, vol. 95, pp. 579-585.
(Continued)

*Primary Examiner* — Marla D McConnell
*Assistant Examiner* — Dujuan Horton
(74) *Attorney, Agent, or Firm* — Venable LLP; Henry J. Daley; Laura G. Remus

(57) ABSTRACT

Tandem electro-optic devices and active materials for electro-optic devices are disclosed. Tandem devices include p-type and n-type layers between the active layers, which are doped to achieve carrier tunneling. Low bandgap conjugated polymers are also disclosed.

24 Claims, 17 Drawing Sheets

(51) Int. Cl.
  *H01L 27/30* (2006.01)
  *H01L 51/00* (2006.01)
  *H01L 51/44* (2006.01)

(56) References Cited

U.S. PATENT DOCUMENTS

| | | |
|---|---|---|
| 2010/0326497 A1 | 12/2010 | Yang et al. |
| 2010/0326525 A1 | 12/2010 | Nguyen et al. |
| 2011/0030789 A1 | 2/2011 | Krebs |

FOREIGN PATENT DOCUMENTS

| | | |
|---|---|---|
| WO | WO-2008/060716 A2 | 5/2008 |
| WO | WO-2009/103705 A1 | 8/2009 |

OTHER PUBLICATIONS

Timmreck et al., "Highly doped layers as efficient electron-hole recombination contacts for tandem organic solar cells," Journal of Applied Physics, 2010, vol. 108, pp. 033108-1-033108-6.
Bijleveld et al., *J. Am. Chem. Soc.*, vol. 131, p. 16616, 2009.
Boudreault et al., *Chem. Mater.*, vol. 23, p. 456, 2011.
Brabec et al., *Adv. Funct. Mater.*, vol. 11, p. 15, 2001.
Chen and Rieke [*Synth. Met.* 1993, (60), 1751.
Chen et al., *Acc. Chem. Res.*, vol. 42, p. 1709, 2009.
Chen et al., *Nat. Photon.*, vol. 3, p. 649, 2009.
Cheng et al., *Chem. Rev.*, vol. 109, p. 5868, 2009.
Chou et al., *Adv. Mater.*, vol. 23, p. 1282, 2011.
Clarke et al., *Chem. Rev.* vol. 110, p. 6763, 2010.
Coakley et al., *Chem. Mater*, vol. 16, p. 4533, 2004.
Dennler et al., Adv. Mater., vol. 20, p. 579, 2008.
Gilot et al., Adv. Mater., vol. 22, p. E67, 2010.
He et al., J. Am. Chem. Soc., vol. 132, p. 1377, 2010.
Huo et al., Angew. Chem. Int. Ed., vol. 49, p. 1500, 2010.
Huo et al., Macromolecules, vol. 42, p. 6564, 2009.
Iraqi and Barker [J. Mater. Chem. 1998, (8) 25].
Kim et al., Science, vol. 317, p. 222, 2007.
Li et al., Applied Physics Letters, vol. 88, p. 253503, 2006.
Li et al., Nat. Mater., vol. 4, p. 864, 2005.
Liang et al., Adv. Mater., vol. 22, p. E135, 2010.
Loewe and McCullough [Macromolecules, 2001, (34), 4324-4333].
Miyaura and Suzuki [Chemical reviews 1995 (95): 2457-2483].
Padinger et al., Adv. Funct. Mater., vol. 13, p. 85, 2003.
Peet et al., Nat. Mater., vol. 6, p. 497, 2007.
Scharber et al., Adv. Mater., vol. 18, p. 789, 2006.
Shrotriya et al., Appl. Phys. Lett., vol. 89, p. 063505, 2006.
Sista et al., Adv. Mater., vol. 22, p. 380, 2010.
Yu et al., Science, .vol. 270, p. 1789, 1995.
International Search Report and Written Opinion of PCT/US2012/031265.
Wiranwetchayan et al., "The Role of Oxide Thin Layer in Inverted Structure Polymer Solar Cells," Materials Sciences and Application, vol. 2, No. 12, 2011, pp. 1697-1701.

* cited by examiner

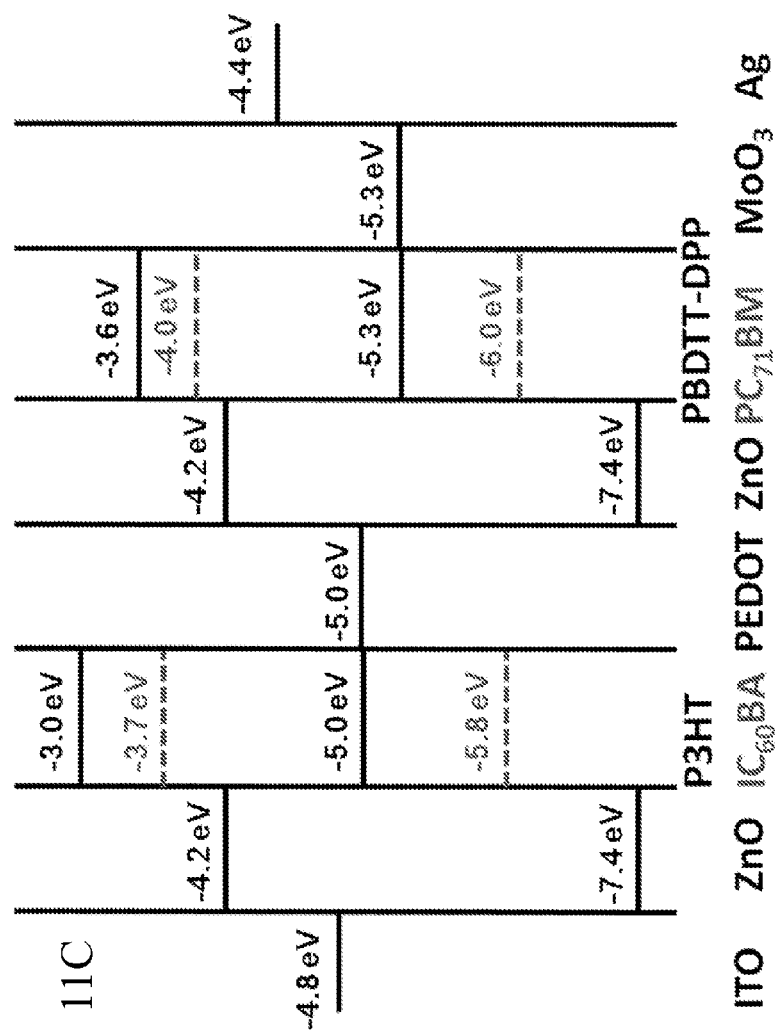
Figure 11 – cont.

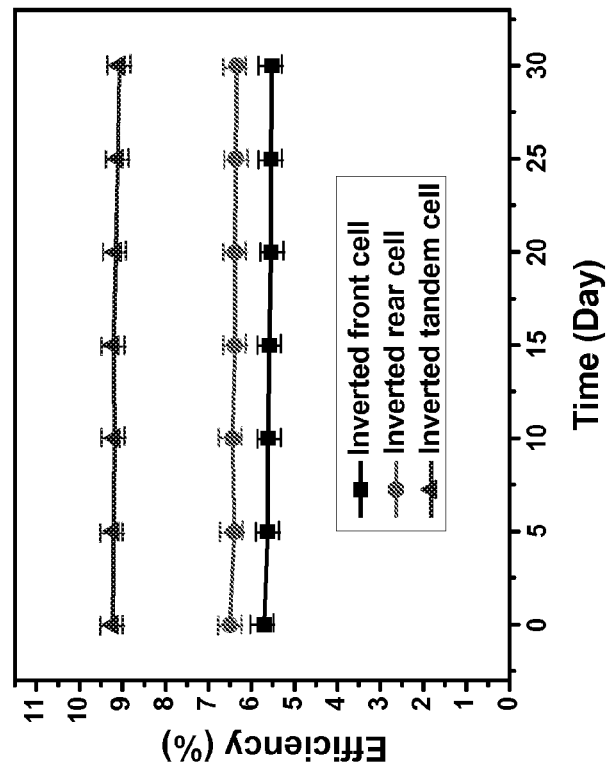
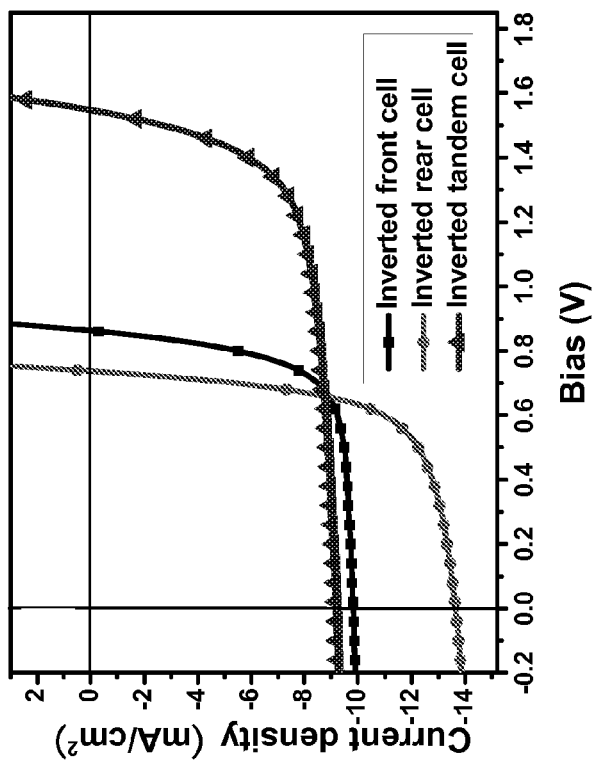
Figure 11 – cont.

ACTIVE MATERIALS FOR ELECTRO-OPTIC DEVICES AND ELECTRO-OPTIC DEVICES

This is a national stage application under 35 U.S.C.§371 of PCT/US2012/031265 filed Mar. 29, 2012, the entire contents of which are incorporated herein by reference and this application claims priority to U.S. Provisional Application No. 61/468,904 filed Mar. 29, 2011 and U S. Provisional Application No. 61/500,832, filed Jun. 24, 2011. The contents of both are incorporated herein by reference in their entirety.

This invention was made with Government support under 0822573, awarded by the National Science Foundation; NOOO14-04-1-0434, awarded by United States Office of Naval Research; and FA9550-09-1-0610, awarded by United States Air Force Office of Scientific Research. The Government has certain rights in the invention.

BACKGROUND

1. Field of Invention

Embodiments of this invention relate to active materials for electro-optic devices and electro-optic devices that use the materials; and more particularly to conjugated polymers as active layer materials for electro-optic devices, and electro-optic devices that have conjugated polymer active layers.

2. Discussion of Related Art

The contents of all references cited herein, including articles, published patent applications and patents are hereby incorporated by reference.

Organic photovoltaic (OPV) devices are very promising for low-cost, flexible, light-weight, large area energy generation applications (Cheng et al., *Chem. Rev.*, vol. 109, p. 5868, 2009; Coakley et al., *Chem. Mater*, vol. 16, p. 4533, 2004; Brabec et al., *Adv. Funct. Mater.*, vol. 11, p. 15, 2001). Tremendous work on designing new materials (Boudreault et al., *Chem. Mater.*, vol. 23, p. 456, 2011), device structures (Yu et al., *Science*, vol. 270, p. 1789, 1995), and processing techniques (Padinger et al., *Adv. Funct. Mater.*, vol. 13, p. 85, 2003; Li et al., *Nat. Mater.*, vol. 4, p. 864, 2005; Peet et al., *Nat. Mater.*, vol. 6, p. 497, 2007) has been carried out to improve the power conversion efficiency (PCE) of OPV devices. So far, polymer solar cells (PSCs) based on conjugated polymers as electron donor materials blended with [6,6]-phenyl-$C_{71}$-butyric acid methyl ester ($PC_{71}BM$) as an electron acceptor material have achieved over 7% PCE using a bulk heterojunction (BHJ) device structure (Chen et al., *Nat. Photon.*, vol. 3, p. 649, 2009; Liang et al., *Adv. Mater.*, vol. 22, p. E135, 2010). Nonetheless, most of the materials suffer from the inherent disadvantages of either lacking a broad absorption range, which limits the utilization of the full solar spectrum (Chen et al., *Acc. Chem. Res.*, vol. 42, p. 1709, 2009), or relatively low carrier mobility, which requires the use of thinner films for efficient charge extraction. This reduces the external quantum efficiency (EQE) and lowers the photocurrent (Clarke et al., *Chem. Rev.* vol. 110, p. 6763, 2010). To utilize solar radiation more effectively, one possible solution is to stack multiple photoactive layers with complementary absorption in series to make a tandem PSC (Kim et al., *Science*, vol. 317, p. 222, 2007). Typically, such a tandem structure has a front cell with a high bandgap material, an interconnecting layer (ICL), and a rear cell with a low bandgap (LBG) material. Furthermore, the structure enables a reduction of potential loss during the photon-to-electron conversion process, and combines the electrical potential of the individual BHJ cells (Kim et al., *Science*, vol. 317, p. 222, 2007).

Tandem solar cells provide an effective way to harvest a broader spectrum of solar radiation by combing two or more solar cells with different absorption together. However, for polymer solar cells (PSCs), the performance of tandem devices lags behind of single layer solar cell due to the lack of proper combination of low and high bandgap polymers. So far, most of the research on tandem PSCs has focused on improving the ICL and only a few cases have demonstrated high efficiency (Kim et al., *Science*, vol. 317, p. 222, 2007; Gilot et al., *Adv. Mater.*, vol. 22, p. E67, 2010; Sista et al., *Adv. Mater.*, vol. 22, p. 380, 2010; Chou et al., *Adv. Mater.*, vol. 23, p. 1282, 2011).

Conjugated polymers are polymers containing electron conjugated units along a main chain, and can be used as active layer materials of some kinds of photo-electric devices, such as polymer light emission devices, polymer solar cells, polymer field effect transistors, etc. As polymer solar cell materials, conjugated polymers should possess some properties, such as high mobility, good harvest of sunlight, easy processibility, and proper molecular energy level. Some conjugated polymers have proven to be good solar cell materials. For example, some derivatives of poly(p-phenylene vinylene), such as MEH-PPV and MDMO-PPV, and some derivatives of poly(3-alky-thiophene), such as P3HT and P3OT, and some conjugated polymers with heterocyclic aromatic rings, such as poly[2,6-(4,4-bis-(2-ethylhexyl)-4H-cyclopenta[2,1-b;3,4-b']-dithiophene)-alt-4,7-(2,1,3-benzothiadiazole)] (PCPDTBT) and poly[4,8-bis-substituted-benzo[1,2-b:4,5-b']dithiophene-2,6-diyl-alt-4-substituted-thieno[3,4-b]thiophene-2,6-diyl] (PBDTTT), have been successfully used as photo-active layer materials. Although the energy conversion efficiency of the solar cell devices based on these polymers has reached to ~7%, it was much lower than that of inorganic semiconductor solar cells.

Therefore, there is accordingly a need in the art for conjugated polymers that have good photovoltaic effect. As mentioned above, ideal conjugated polymer materials for polymer solar cells should have high mobility, so main chains of the conjugated polymers should have planar structure, which could be helpful to form $\pi$-$\pi$ stacking structures and facilitate charge transfer between two adjacent main chains; they should have low band gap to provide good harvest of sunlight; they also should have proper molecular energy levels matching with electrodes and electron acceptor materials in polymer solar cell devices. It would be desirable to provide conjugated polymers as photovoltaic materials that possess properties as mentioned above.

SUMMARY

Some embodiments of the invention include inverted tandem polymer photovoltaic devices having a hole-extracting electrode and an electron extracting electrode spaced apart from said hole-extracting electrode. The inverted device further includes a first bulk hetero-junction polymer semiconductor layer and a second bulk hetero-junction polymer semiconductor layer spaced apart from said first bulk hetero-junction polymer semiconductor layer. Between the first and second bulk hetero-junction polymer semiconductor layers, the device includes a p-type layer in physical contact with one of the first and second bulk hetero-junction polymer semiconductor layers, and an n-type layer in physical contact with the other of the first and second bulk hetero-junction polymer semiconductor layer, where at least one of the p-type layer and the n-type layer is doped to an extent that charge carriers tunnel through the p-type and/or n-type layer.

Some embodiments of the invention include polymers having a repeated unit having the structure of formula (I)

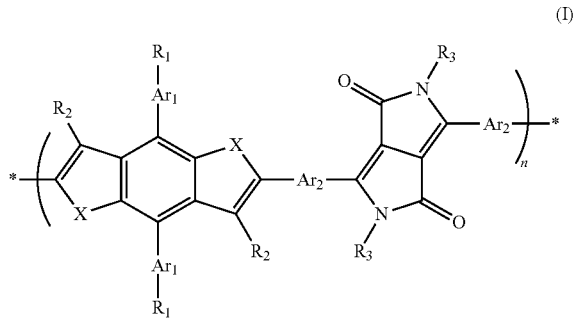

(I)

wherein $R_1$, $R_2$ and $R_3$ are independently selected from alkyl groups with up to 18 C atoms, aryls and substituted aryls. X is selected from Oxygen, Sulfur, Selenium and Nitrogen atoms. $Ar_1$ and $Ar_2$ are each, independently, one to five monocyclic arylene, bicyclic arylene, and polycyclic arylene, monocyclic heteroarylene, bicyclic heteroarylene and polycyclic heteroarylene groups, either fused or linked.

Some embodiments of the invention include electronic or electro-optic devices having a first electrode, a second electrode spaced apart from said first electrode, and a layer of active material disposed between the first electrode and second electrodes, where the active layer includes a polymer having a repeated unit having the structure of formula (I)

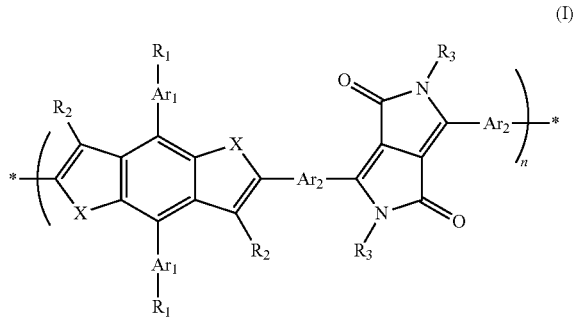

(I)

wherein n is an integer greater than 1. $R_1$, $R_2$ and $R_3$ are independently selected from alkyls, aryls and substituted aryls. X is selected from Oxygen, Sulfur, Selenium and Nitrogen atoms. $Ar_1$ and $Ar_2$ is one to five monocyclic arylene, bicyclic arylene, polycyclic arylene, monocyclic heteroarylene, bicyclic heteroarylene or polycyclic heteroarylene groups, either fused or linked.

BRIEF DESCRIPTION OF THE DRAWINGS

The invention may be better understood by reading the following detailed description with reference to the accompanying figures in which:

FIG. 5A shows UV-vis absorption spectrum of LT13. FIG. 5B shows electrochemical cyclic voltammetry spectrum of LT13.

FIG. 9A shows the Chemical structure of PBDTT-DPP. FIG. 9B shows UV-visible absorption spectra of PBDTT-DPP and P3HT film. The UV-visible absorption profiles of PBDTT-DPP and P3HT show that the two materials cover the solar spectrum from 350 to 850 nm complementarily.

FIG. 10A shows J-V characteristics of single cell devices with regular and inverted structures. FIG. 10B shows EQE of the corresponding devices. Both regular and inverted single cell devices show identical performance with a $V_{OC}$ of 0.74 V, $J_{SC}$ of ~14 mA/cm$^2$, FF of ~65% and PCE of about 7%. The devices exhibit a very broad response range covering 350 nm to 850 nm.

FIG. 11A shows chemical structures of P3HT, IC$_{60}$BA and PC$_{71}$BM. FIG. 11B shows device structure of an inverted tandem solar cell. FIG. 11C shows the energy diagram of inverted tandem devices. FIG. 11D shows J-V characerstics of an inverted tandem solar cell. FIG. 11E shows stability of inverted front cells, rear cells and tandem cells.

FIG. 15A shows AFM phase images after no further treatment. FIG. 15B shows AFM phase images after treatment with 2% DIO in dichlorobenzene. FIG. 15C shows AFM phase images after annealing at 110° C. for 15 min. FIG. 15D shows AFM phase images after solvent annealing.

DETAILED DESCRIPTION

In describing embodiments of the present invention, specific terminology is employed for the sake of clarity. However, the invention is not intended to be limited to the specific terminology so selected. It is to be understood that each specific element includes all technical equivalents which operate in a similar manner to accomplish a similar purpose. The broad concepts of the current invention should not be construed as being limited to the specific examples.

Definitions and Nomenclature

Unless otherwise indicated, this invention is not limited to specific starting materials, regents or reaction conditions, as such may vary.

The term "alkyl" as used herein refers to a branched or unbranched saturated hydrocarbon group typically although not necessarily containing 1 to 18 carbon atoms, 4 to 18 carbon atoms, or 6 to 12 carbon atoms, such as methyl, ethyl, n-propyl, isopropyl, n-octyl, 2-ethylhexyl, 2-butyloctyl, isooctyl, decyl, and the like, as well as cycloalkyl groups such as cyclopentyl, cyclohexyl and the like.

The terms "aryl" and "arylene" as used herein refer to an aromatic hydrocarbon ring system. Aryl or arylene groups may be monocyclic, bicyclic or polycyclic. Monocyclic aryl or arylene has a single aromatic ring. Bicyclic aryl or arylene rings have two fused rings. Polycyclic aryl or arylene has more than two fused rings and may have 3, 4, 5, 6, or more fused rings.

The term "heteroarylene" as used herein refers to a hydrocarbon arylene in which one or more carbon atoms are replaced with a "heteroatom" other than carbon, e.g., nitrogen, oxygen, sulfur, silicon, selenium, phosphorus.

The term "substituted" as in "substituted aryl," "substituted arylene", "substituted heteroarylene", and the like, is meant that in the arylene or heteroarylene, or other moiety, at least one hydrogen atom bound to a carbon (or other) atom is replaced with one or more non-hydrogen substituents. Such substituents include, but not limited to, functional groups such as alkyl (as defined herein), halo (fluoro, chloro, bromo, or iodo), haloalkyl (alkyl, as defined herein, substituted with one or more F, Cl, Br, or I atom, such as, for example, trifluoromethyl), hydroxyl, alkylthio, alkoxy, aryloxy, alkylcarbonyl, acyloxy, nitro, cyano, and the like.

Figure 1:
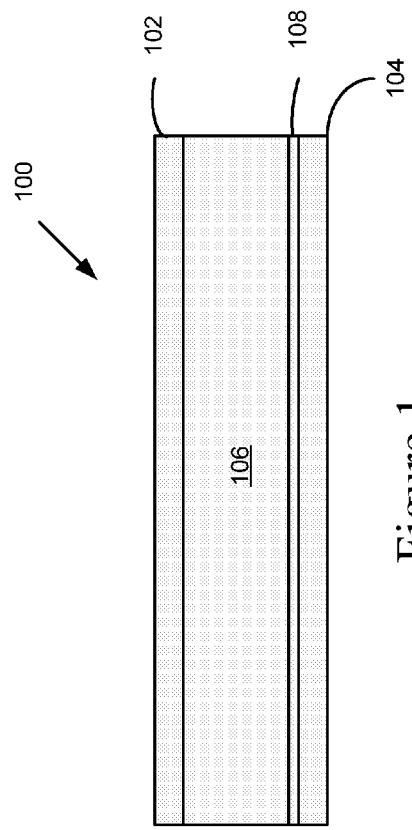
FIG. 1 is a schematic illustration of an electro-optic device 100 according to an embodiment of the current invention.
Figure 3:
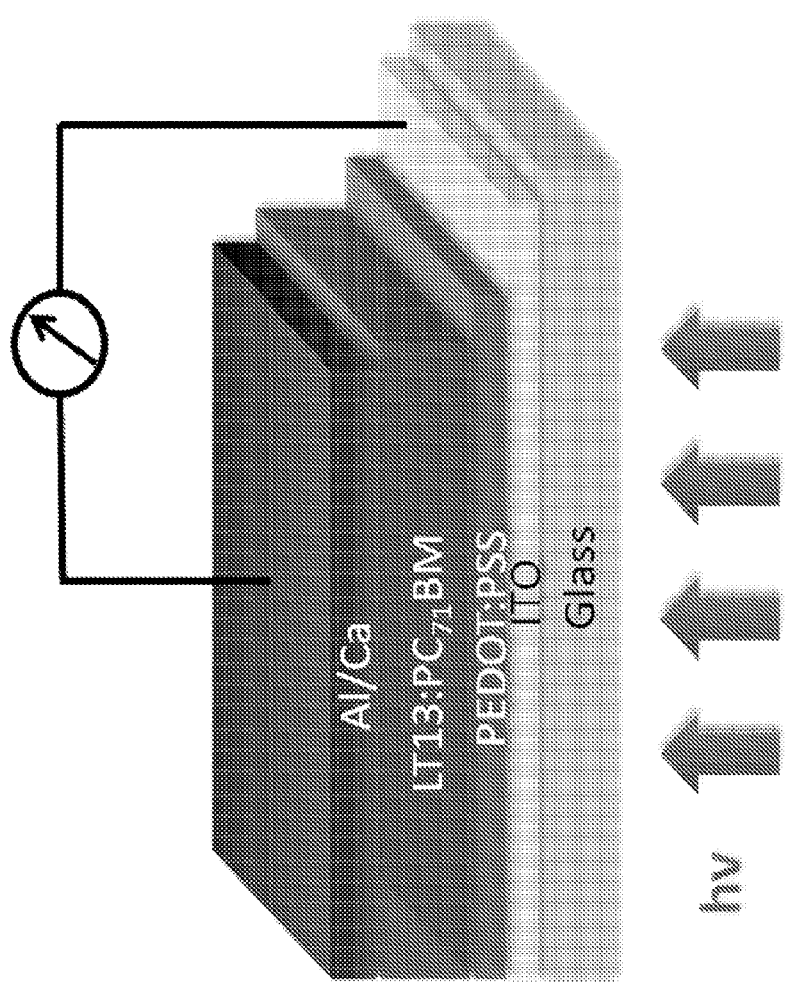
FIG. 3 is a schematic illustration of an electro-optic device according to an embodiment of the current invention.

FIG. 1 and FIG. 3 are schematic illustrations of single-layer electro-optic devices according to some embodiments of the current invention.

Tandem Photovoltaic Devices

Some embodiments of the current invention include tandem polymer photovoltaic devices having a hole extracting electrode and an electron extracting electrode spaced apart from the hole extracting electrode. The tandem polymer photovoltaic device further includes a first bulk hetero-junction polymer semiconductor layer and a second bulk hetero junction polymer semiconductor layer spaced apart from said first bulk hetero-junction polymer semiconductor layer.

Between the first and second bulk hetero-junction polymer semiconductor layers, the tandem photovoltaic device further includes a p-type layer in physical contact with one of the first and second bulk hetero-junction polymer semiconductor layers, and an n-type layer in physical contact with the other of the first and second bulk hetero-junction polymer semiconductor layer where at least one of the p-type layer and the n-type layer is doped to an extent that charge carriers tunnel through the p-type and/or n-type layer.

As used herein, the first bulk hetero-junction polymer semiconductor layer and second bulk hetero-junction polymer semiconductor layer may be referred to as "active layers."

Figure 2:
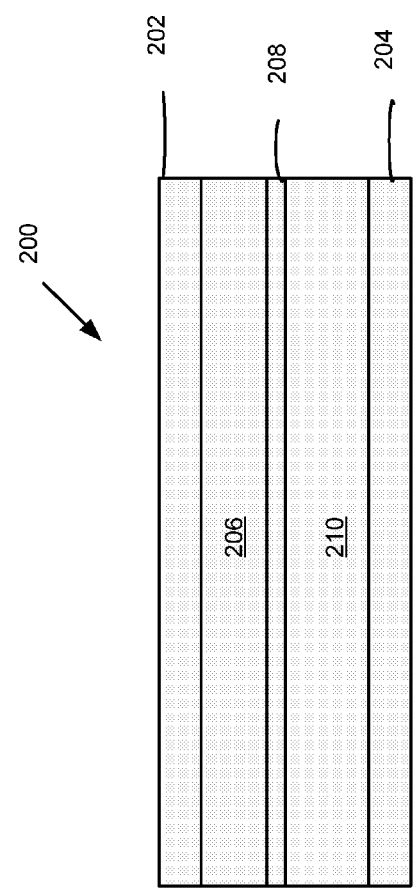
FIG. 2 is a schematic illustration of an electro-optic device 200 according to another embodiment of the current invention.

FIG. 2 is a schematic illustration of a tandem electro-optic device 200 according to an embodiment of the current invention. The electro-optic device 200 has a first electrode 202, a second electrode 204 spaced apart from the first electrode 202, and an active layer 206 disposed between the first electrode and the second electrode. This embodiment is an example of a tandem electro-optic device that has a second active layer 210 between the first electrode 202 and the second electrode 204. The electro-optic device 200 also includes a region 208, between the two active layers 206 and 210, having a p-type layer in physical contact with one of the first and second bulk hetero-junction polymer semiconductor layers, and an n-type layer in physical contact with the other of the first and second bulk hetero-junction polymer semiconductor layer. Devices according to the current invention are not limited to only one or two active layers; they may have multiple active layers in some embodiments of the current invention.

Figure 4:
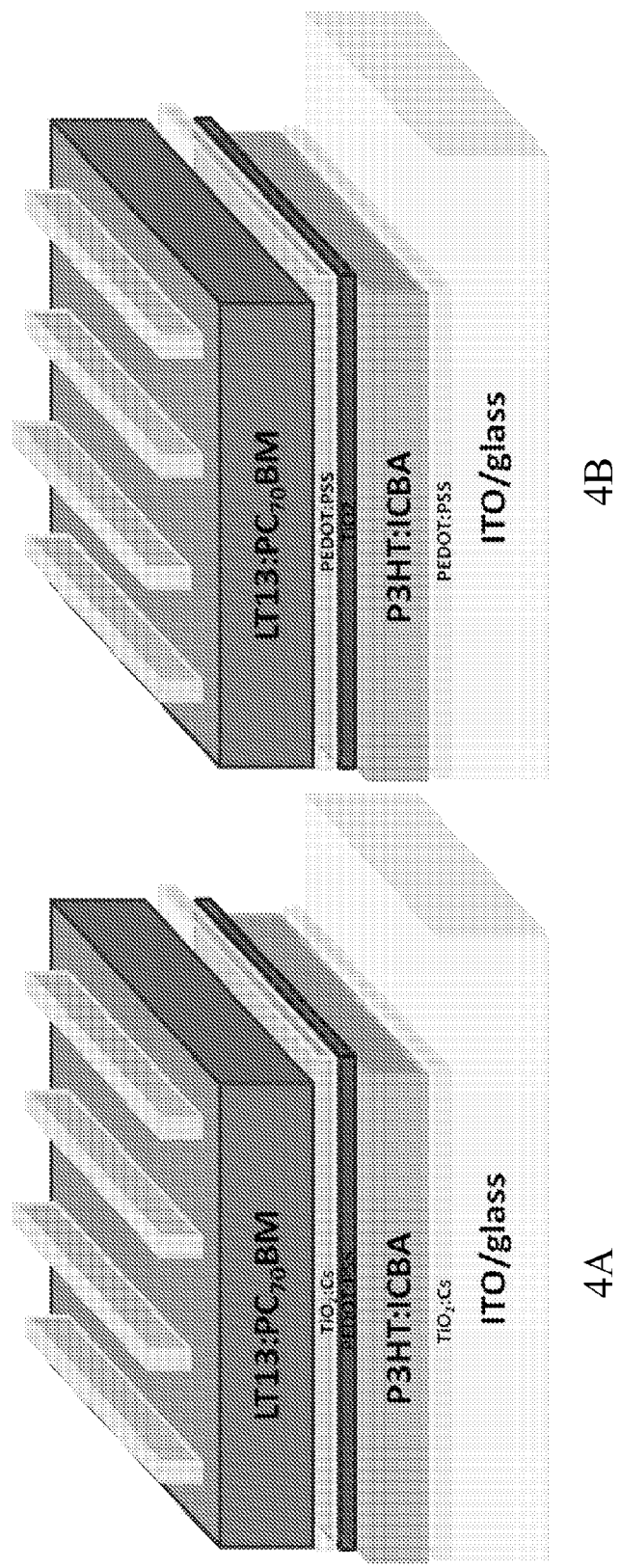
FIG. 4 is a schematic illustration of an electro-optic device according to another embodiment of the current invention.

FIG. 4 is a schematic illustration of tandem polymer solar cell device according to another embodiment of the current invention. FIG. 4 shows a device with multiple active layers. For example, a tandem photovoltaic cell that has two or more active layers with thin interfacial layers. FIG. 4A is an inverted structure and FIG. 4B is a conventional structure for a tandem solar cell. The schematic illustrations of FIGS. 2 and 4 are shown as examples. Devices according to other embodiments of the current invention are not limited to these specific examples.

Physical contact, as used here, means that the two layers are directly adjacent to each other, without an intervening layer.

A charge carrier may be either an electron or hole, depending on the type of layer. In a p-type layer, the charge carrier is a hole. In an n-type layer, the charge carrier is an electron.

The p-type layer and n-type layer between the two active layers promote tunneling of electrons and holes across the layers without significant loss of voltage across the device. This is achieved by doping at least one of the n-type layer and p-type such that the related charge carriers tunnel through the layer. In tandem devices according to some embodiments of the invention, charge carriers tunnel through the p-type and/or n-type layer and then recombination occurs. For example, in an inverted tandem device, only electrons generated in the active layer closest to the transparent electrode and holes generated in the active layer further from the transparent electrode can be extracted by the electrodes. The holes generated by the front cell and electrons generated by the rear cell will recombine after tunnelling through either the p-type and/or n-type layer. Doping the n-type and/or p-type layer makes the tunneling easier and may enhance conductivity.

Charge carrier tunneling depends on the material used to form the layer and the type of dopant, for example. If charge carrier tunneling does not occur at a particular concentration of dopant in a particular material, more dopant may be added to induce tunneling in that layer. Similarly, if doping only one of the n-type layer and p-type layer is insufficient to create carrier tunneling, both the n-type layer and p-type layer may be doped.

As used herein, a hole extracting electrode is an electrode where holes produced by the photovoltaic active layer are extracted from the device. A hole extracting electrode may be a single layer electrode or composite electrode, and may be composed of, for example, silver (Ag), or aluminum (Al). Examples of materials used in single layer electrode include those with high work function (>4 eV) such as Al, Ag, Au, Pt, ITO, graphene, graphite, and combinations thereof. Composite electrodes may include, for example, a metal electrode with p-type interface layer such as PEDOT:PSS, PANI, MoOx, V2O5, VOx, WO3, WOx, NiO, NiOx, grapheme oxide, or any combination of the above.

As used herein, an electron extracting electrode is an electrode where electrons produced by the photovoltaic active layer are extracted from the device. An electron extracting electrode may be a single layer electrode or a composite electrode. The electron extracting electrode may be composed of, for example, Indium-tin-oxide (ITO). The electron-extracing electrode may be, for example, a low work function metal such as, for example, Ca, Ba, Mg, Mg:Ag alloy, combined with stable electrode such as Al, Ag, ITO, Au or combinations thereof. Composite electron-extracting electrodes include, for example, metal electrode (such as Al, Ag, Au, Pt, ITO, graphene, graphite, combination of them), combined with n-type interface layer such as metal oxide (ZnO, ZnOx, TiO2, TiOx), salts (Cs2CO3, LiF, CsF etc.), polyelectrolyte, and the combination of two or more of the above.

In some embodiments, at least one of the electrodes is transparent. In some embodiments, the electron-extracting electrode is transparent.

In some embodiments, one of the two electrodes is formed on a substrate, and the other layers added one at a time on the first electrode. In some embodiments, the electron-extracting electrode may be on a transparent substrate, and the device fabricated on the electron-extracting electrode. For example, the electron-extracting electrode may be Indium-tin-oxide (ITO) on a transparent glass substrate.

As used herein, a bulk hetero-junction polymer semiconductor layer includes a blend of a photoactive polymer and admixer. The combination of polymer and admixer are selected such that charge and/or energy transfer takes place between the admixer and the polymer when an excitation source, including light or voltage, is applied.

Some embodiments include devices with more than two bulk hetero junction polymer semiconductor layers. Any additional bulk hetero-junction polymer semiconductor layers may be separated from the first or second bulk hetero-junction polymer semiconductor layer by a p-type/n-type layer as described herein, may include another type of interlayer, or use no interlayer.

Some embodiments include an "inverted" tandem structure. In an inverted tandem device as used herein, the p-type layer between the two active layers is closer to the electron-extracting electrode than the n-type layer. In some embodiments of an inverted tandem structure, the electron-extracting electrode is transparent. Some embodiments of an inverted tandem device further include an electron transporting layer (of an n-type material) adjacent to the electron-extracting electrode.

In some embodiments, the p-type layer is in physical contact with the n-type layer. In other words, in these embodiments, there is no additional layer between the p-type layer and the n-type layer.

The p-type layer may be composed of any p-type semiconducting material, so long as when the p-type layer is doped the p-type semiconducting material is compatible with the dopant and holes tunnel through the doped p-type layer. The p-type semiconducting material may be organic or inorganic. Examples of organic p-type materials include, for example, poly(3,4-ethylenedioxythiophene) (PEDOT), poly(aniline) (PANI) or other p-type organic material. Examples of inorganic p-type material include, for example, $MoO_3$, MoOx, $V_2O_5$, VOx, WO3, WOx, NiO, NiOx, graphene oxide, or any combination of the above. In some embodiments, the p-type layer include a p-type polymer, such as, for example, poly(3,4-ethylenedioxythiophene) (PEDOT). In some embodiments, the p-type layer includes a p-type metal oxide, such as, for example, $MoO_x$, $MoO_3$, or $V_2O_5$.

In some embodiments, the p-type layer is doped to an extent that holes tunnel through the doped p-type layer. In principle, any p-type dopant may be used in the p-type layer, so long as it is compatible with the p-type material forming the layer. Examples of p-type dopants for organic p-type layers, include, for example, acid, such as poly(styrenesulphonic acid), $I_2$, $H_2O_2$, or other p-type dopant. Examples of p-type dopants for inorganic (including p-type metal oxide) p-type layers include, for example $FeCl_3$, $I_2$, $H_2O_2$. As will be apparent to one of ordinary skill, some dopants may be used with organic or inorganic p-type materials.

The n-type layer may be composed of any n-type semiconducting material, so long as when the n-type layer is doped, the n-type semiconducting material is compatible with the dopant and electrons tunnel through the doped n-type layer. The n-type semiconducting material may be organic or inorganic material. Examples of organic n-type materials include, for example, polyelectrolyte, small molecules (such as, for example, bathocuproine, 3-(Biphenyl-4-yl)-5-(4-tert-butylphenyl)-4-phenyl-4H-1,2,4-triazole, 2-(4-Biphenylyl)-5-phenyl-1,3,4-oxadiazole, Bis(8-hydroxy-2-methylquinoline)-(4-phenylphenoxy)aluminum, Tris-(8-hydroxyquinoline) aluminum, among others), graphene, graphite. Examples of inorganic n-type materials include, for example, metal oxides (e.g. ZnO, ZnOx, TiO2, TiOx), salts (e.g. $Cs_2CO_3$, LiF, CsF etc.), and the combination of two or more of them. In some embodiments, the n-type layer is an n-type metal oxide, such as, for example, ZnO or $TiO_2$. In some embodiments, the n-type layer includes ZnO.

In some embodiments, the n-type layer is doped to an extent that electrons tunnel through the n-type layer. In principle, any n-type dopant may be used in the n-type layer, so long as it is compatible with the n-type material forming the layer. Examples of n-type dopants for organic n-type layers include, for example low work function metals such as Na, Li, Al, low work function fluorides such as LiF, CsF, low work function salts such as $Cs_2CO_3$. Examples of n-type dopants for inorganic n-type layers include, for example low work function metals such as Na, Li, Al, low work function fluorides such as LiF, CsF, low work function salts such as Cs2CO3. As will be apparent to one of ordinary skill, some n-type dopants may be used with both organic and inorganic n-type materials.

In some embodiments, both the p-type layer and said n-type layer are doped, so long as the charge carriers tunnel through the layers. The same dopants described above for use in individual p-type or n-type layers may be used.

In some embodiments, the device further includes an electron transporting layer. In some embodiments, such as inverted tandem devices, the electron transporting layer may be between the electron-extracting electrode and the first bulk hetero-junction polymer semiconductor layer or second bulk hetero-junction polymer semiconductor layer, whichever is closest to the electron extracting electrode. In some embodiments of tandem devices, the electron transporting layer may be between the hole-extracting electrode and the first bulk hetero-junction polymer semiconductor layer or second bulk hetero-junction polymer semiconductor layer, whichever is closest to the hole-extracting electrode. Any n-type material may be used in the electron transporting layer, including those described for the n-type layer between the two active layers. In some embodiment, the material in the electron transporting layer may be the same as or different than the material used in the n-type layer between the two active layers. The electron transporting layer may be, but need not be, doped. In some embodiments, the electron transporting layer may be, for example, an n-type metal oxide, such as, for example ZnO.

In some embodiments, the tandem polymer photovoltaic device further includes a hole transporting layer. In some embodiments, such as inverted tandem devices, the hole transporting layer may be between the hole-extracting electrode and the first bulk hetero-junction polymer semiconductor layer or second bulk hetero-junction polymer semiconductor layer, whichever is closest to the hole extracting electrode. In some embodiments of tandem devices, the hole transporting layer may be between the electron-extracting electrode and the first bulk hetero-junction polymer semiconductor layer or second bulk hetero junction polymer semiconductor layer, whichever is closest to the electron-extracting electrode. Any p-type material may be used in the hole transporting layer, including those described for the p-type layer between the two active layers. The material in the hole transporting layer may be the same as or different than the material used in the p-type layer between the two active layers. The hole transporting layer may be, but need not be, doped. In some embodiments, the electron transporting layer may be, for example, a p-type organic material, such as, for example, PEDOT-PSS, or a p-type metal oxide, such as, for example $MoO_3$ or $V_2O5$.

In some embodiments, the first bulk hetero-junction polymer semiconductor layer is closer to the transparent electrode than the second bulk hetero-junction polymer semiconductor layer. In some embodiments where the transparent electrode is the electron extracting electrode, the first bulk hetero-junction polymer semiconductor layer is closer to the electron extracting electrode.

Any two photoactive polymers may be used in the tandem photovoltaic device described herein. However, it may be advantageous for one polymer to have a wider bandgap and one polymer to have a narrower bandgap. Of the two photoactive polymers, the polymer with the wider bandgap may be described as a high bandgap polymer, while the polymer with the narrower bandgap may be described as a low bandgap polymer.

In some embodiments, the high bandgap polymer may have a bandgap greater than about 1.6, greater than about 1.7, greater than about 1.8, greater than about 1.9, or greater than about 2.0 eV. Examples of high bandgap polymers that may be used include poly(3-hexylthiophene) (P3HT) or other polymer materials, such as, for example, derivatives of poly(p-phenylene vinylene), such as MEH-PPV and MDMO-PPV, and some derivatives of poly(3-alky-thiophene), such as P3HT and P3OT. Specific examples include, poly(3-hexylthiophene) (P3HT), Poly[[9-(1-octylnonyl)-9H-carbazole-2,7-diyl]-2,5-thiophenediyl-2,1,3-benzothiadiazole-4,7-diyl-2,5-thiophenediyl], poly[4,8-bis((2-ethylhexyl)oxy)benzo[1,2-b:4,5-b']dithiophene-2,6-diyl-alt-5-(2-ethylhexyl)-4H-thieno[3,4-c]pyrrole-4,6(5H)-dione-1,3-diyl] (PBDT-TPD), poly[(4,4'-bis(2-ethylhexyl)dithieno[3,2-b:2',3'-d]silole)-2,6-diyl-alt-5-(2-ethylhexyl)-4H-thieno[3,4-c]pyrrole-4,6(5H)-dione-1,3-diyl] (PDTS-TPD), poly[(4,4'-bis(2-ethylhexyl)dithieno[3,2-b:2',3'-d]germole)-2,6-diyl-alt-5-(2-ethylhexyl)-4H-thieno[3,4-c]pyrrole-4,6(5H)-dione-1,3-diyl] (PDGS-TPS), poly[4,8-(3-hexylundecyl)benzo[1,2-b:4,5-b']dithiophene-2,6-diyl-alt-4,7-bisthiophen-2-yl-2-(2-butyloctyl)-5,6-difluoro-2H-benzo[d][1,2,3]triazole-5,5'-diyl] (PBnDT-FTAZ). Poly benzodithiophen-alt-thienothiophene (PTB series, BG~1.6 eV) can also be used as high bandgap polymer.

In some embodiments, the low bandgap polymer has a bandgap of less than about 1.9 eV, less than about 1.8 eV or less than about 1.7 eV, so long as the low bandgap polymer has a lower bandgap than the high bandgap polymer. Examples of low bandgap polymers that may be used include the conjugated polymers described herein, or other low bandgap polymers, such as, for example, poly[4,8-bis-substituted-benzo[1,2-b:4,5-b']dithiophene-2,6-diyl-alt-4-substituted-thieno[3,4-b]thiophene-2,6-diyl] (PBDTTT), poly{2,6'-4,8-di(5-ethylhexylthienyl)benzo[1,2-b;3,4-b]dithiophene-alt-5-dibutyloctyl-3,6-bis(5-bromothiophen-2-yl) pyrrolo[3,4-c]pyrrole-1,4-dione} (PBDTT-DPP), poly[2,6-(4,4-bis-(2-ethylhexyl)-4H -cyclopenta[2,1-b;3,4-b']dithiophene)-alt-4,7-(2,1,3-benzothiadiazole)] (PCPDTBT), poly[(4,4'-bis(2-ethylhexyl)dithieno[3,2-b:2',3'-d]silole)-2,6-diyl-alt-(2,1,3-benzothiadiazole)-4,7-diyl] (PSBTBT), poly[3,6-bis(4'-dodecyl[2,2'-bithiophen]-5-yl)-2,5-bis(2-hexyldecyl)-2,5-dihydro-pyrrolo[3,4-c]pyrrole-1,4-dione-alt-thiophene-2,5-diyl] (PDPP5T). In some embodiments, the polymers described herein may be used as the low bandgap polymer.

In some embodiments, the polymer used in the first bulk hetero-junction polymer semiconductor layer has a wider bandgap than the polymer used in the second bulk hetero-junction polymer semiconductor layer. In some of these embodiments, the first bulk hetero-junction polymer semiconductor layer is closer to the transparent electrode. Thus, light passing through the transparent electrode passes first through the bulk hetero-junction polymer semiconductor layer having a polymer with a wider bandgap, and then through the bulk hetero-junction polymer semiconductor layer having a polymer with a narrower bandgap.

The absorbance in the region between about 300 nm and about 1000 nm of the two polymers used in the first and second bulk hetero-junction polymer semiconductor layers affects the performance of the device. In some embodiments, to improve performance, the absorbance spectra of the two polymers in the region between about 300 nm and about 1000 nm may be separated, though some overlap between the absorbance spectra of the two polymers may be acceptable to absorb light across a broad range of wavelengths.

In some embodiments, the separation between absorbance spectra of the two polymers may be determined by the wavelength where each polymer has maximum absorbance. In these embodiments, the polymer used in the first bulk hetero-junction polymer semiconductor layer may have an absorbance maximum between about 400 nm and about 700 nm and the polymer used in the second bulk hetero-junction polymer semiconductor layer as an absorbance maximum between 700 nm and about 1000 nm.

In some embodiments, the wavelength of maximum absorbance (absorbance maximum) of the polymer used in the first bulk hetero-junction polymer semiconductor layer is more than 20 nm, more than 30 nm, more than 40 nm, more than 50 nm, more than 75 nm, more than 100 nm, more than 125 nm, more than 150 nm, more than 175 nm, more than 200 nm, more than 225 nm, or more than 250 nm shorter than the absorbance maximum of the polymer used in the second bulk hetero-junction polymer semiconductor layer. In other words, the wavelength where the first polymer has maximum absorbance should be shorter by some degree than the wavelength where the second polymer has maximum absorbance.

In some embodiments, the wavelength of the trailing edge at 10%, 15%, 20%, 25%, 30%, 35%, 40%, 45%, 50%, 55%, or 60% of the maximum absorbance of the absorbance spectrum between 300 nm and 1000 nm of the polymer used in the first bulk hetero-junction polymer semiconductor layer is shorter than or equal to the wavelength of the leading edge at 10%, 15% 20%, 25%, 30%, 35%, 40%, 45%, 50%, 55%, or 60% of the maximum absorbance the absorbance spectrum between 300 nm and 1000 nm of the polymer used in the second bulk hetero-junction polymer semiconductor layer. To make this comparison the wavelength of absorbance of the first polymer should be measured at the trailing edge of the absorbance spectrum between 300 nm and 1000 nm at the point 10%, 15%, 20%, 25%, 30%, 35%, 40%, 45%, 50%, 55%, or 60% of the maximum absorbance intensity (i.e. at the point where the height of the absorbance spectrum is 10%, 15%, 20%, 25%, 30%, 35%, 40%, 45%, 50%, 55%, or 60% of the height of the absorbance spectrum at the absorbance maximum). The wavelength of absorbance of the second polymer should be measured at the leading edge of the absorbance spectrum at the point 10%, 15%, 20%, 25%, 30%, 35%, 40%, 45%, 50%, 55%, or 60% of the maximum absorbance intensity (i.e. at the point where the height of the absorbance spectrum is 10%, 15%, 20%, 25%, 30%, 35%, 40%, 45%, 50%, 55%, or 60% of the height of the absorbance spectrum at the absorbance maximum). The value determined for the first polymer should be shorter than or equal to the value determined for the second polymer.

In some embodiments, the absorbance at the wavelength halfway between the absorbance maximum of the polymer used in the first bulk hetero-junction polymer semiconductor layer and the absorbance maximum of the polymer used in the second bulk hetero-junction polymer semiconductor layer in the sum of the normalized absorbance spectra measured between 300 nm and 1000 nm is greater than 50%, greater than 45%, greater than 40%, greater than 35%, greater than 30%, greater than 25%, greater than 20%, greater than 15%, or greater than 10% of the normalized maximum absorbance of either polymer individually. In some embodiments, the absorbance at the wavelength halfway between the absorbance maximum of the polymer used in the first bulk hetero-junction polymer semiconductor layer and the absorbance maximum of the polymer used in the second bulk hetero-junction polymer semiconductor layer in the sum of the normalized absorbance spectra is less than 150%, less than 140%, less than 130%, less than 120%, less than 110%, less than 100%, or less than 90% of the normalized maximum absorbance of either polymer individually. To measure this, the absorbance spectrum of each polymer should be measured, the wavelength of maximum absorbance of each polymer determined and each absorbance spectrum normalized so that each has the same maximum absorbance intensity at the wavelength of maximum absorbance for each polymer. For example, if the absorbance of the first polymer at its maximum absorbance wavelength is 1.0, the absorbance spectrum of the second polymer should be adjusted so that the absorbance at the maximum absorbance of the second polymer is also 1.0. The two normalized spectra, measured between about 300 nm and about 1000 nm should then be added together to produce a combined spectrum (a sum of the normalized spectra). At the wavelength halfway between the absorbance maximum of the first polymer and the absorbance maximum of the second polymer, the absorbance of the combined spectrum may be greater than 50%, greater than 45%, greater than 40%, greater than 35%, greater than 30%, greater than 25%, greater than 20%, greater than 15%, or greater than 10% of the normalized absorbance of the individual polymers at their absorbance maximum. Likewise, At the wavelength halfway between the absorbance maximum of the first polymer and the absorbance maximum of the second polymer, the absorbance of the combined spectrum may be less than 150%, less than 140%, less than 130%, less than 120%, less than 110%, less than 100%, or less than 90% of the normalized absorbance of the individual polymers at their absorbance maximum. For example, where the absorbance spectra of the first polymer and second polymer have been normalized so that each has an absorbance of 1.0 at the absorbance maximum, where the first polymer has an absorbance maximum at 500 nm, and the second polymer has an absorbance maximum at 800 nm. The absorbance at 650 nm of the addition spectrum may be greater than 50%, greater than 45%, greater than 40%, greater than 35%, greater than 30%, greater than 25%, greater than 20%, greater than 15%, or greater than 10% of the normalized absorbance of the absorbance at 500 nm and 800 nm. The absorbance at 650 nm of the addition spectrum may be less than 150%, less than 140%, less than 130%, less than 120%, less than 110%, less than 100%, or less than 90% of the absorbance at 500 nm and 800 nm.

In some embodiments, the electron extracting electrode is a transparent electrode, and the first bulk hetero-junction polymer semiconductor layer is closer to the transparent electrode than the second bulk hetero-junction polymer semiconductor layer. The p-type layer between the two active layers is closer to the electron extracting electrode, creating an inverted tandem device.

Figure 11:
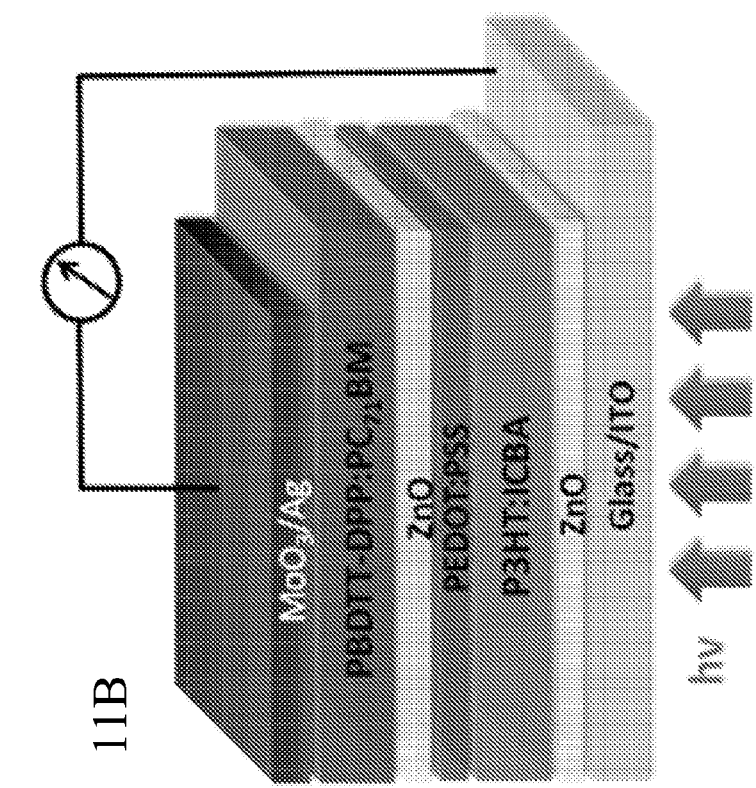
FIG. 11 shows an embodiment of the invention using electron acceptors.
Figure 11:
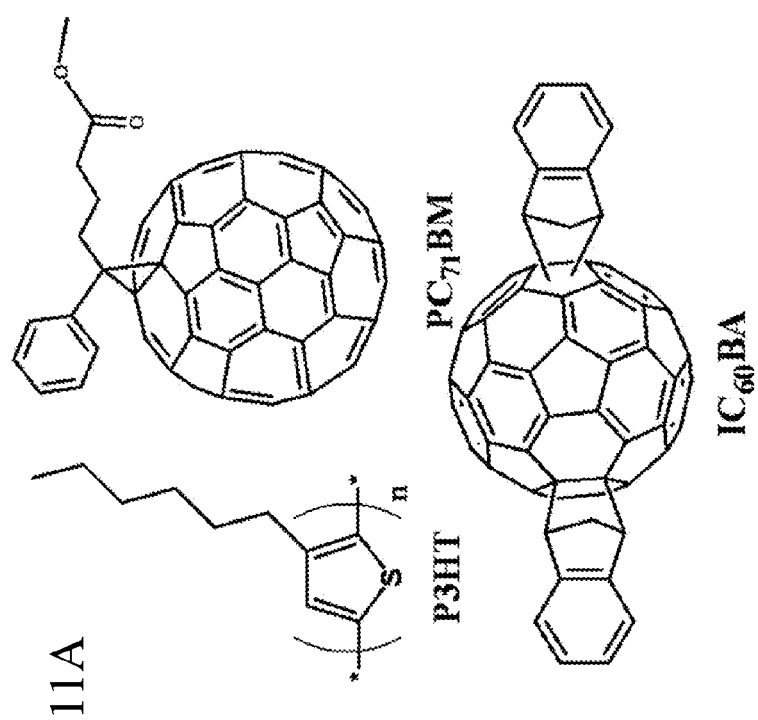

FIG. 11B shows a schematic illustration of an example embodiment of an inverted tandem device having a transparent electron extracting electrode of indium-tin-oxide (ITO), and a hole extracting electrode of silver (Ag). The first bulk hetero-junction polymer semiconductor layer is closer to the transparent electrode, and includes a high bandgap polymer P3HT blended with admixer ICBA. The second bulk hetero-junction polymer semiconductor layer includes a low bandgap polymer PBDTT-DPP (a polymer described in detail below) and admixer $PC_{71}BM$. Between the active layers is a p-type layer closer to the transparent electrode made of PEDOT doped with PSS, and an n-type layer of ZnO.

The example device in FIG. 11B also includes an electron transporting layer of ZnO between first bulk hetero-junction polymer semiconductor layer and the electron extracting electrode. The example device in FIG. 11B also includes a hole transporting layer of $MoO_3$ between the second bulk hetero-junction polymer semiconductor layer and the hole extracting electrode. The schematic illustration in FIG. 11B is shown as an example. Devices according to other embodiments of the current invention are not limited to this specific example.

Polymers

Conjugated polymer materials for polymer solar cell should have high mobility, so the main chains of the conjugated polymers should have a planar structure according to some embodiments of the current invention. This can also be helpful to form π-π stacking structures and facilitate charge transfer between two adjacent main chains. Some materials should have a low band gap to provide good harvesting of sunlight; they also should have proper molecular energy levels that match with electrode and electron acceptor materials in polymer solar cell devices. It thus would be desirable according to some embodiments of the current invention to provide conjugated polymers as photovoltaic materials that possess some or all of the properties mentioned above.

Some embodiments of the invention include polymers having repeated units of the general structure of formula (I)

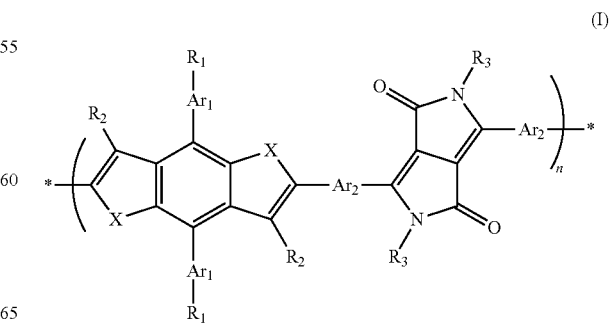

(I)

where $R_1$, $R_2$, and $R_3$ are independently selected from alkyl groups with up to 18 C atoms, aryls and substituted aryls. X is selected from Oxygen, Sulfur, Selenium and Nitrogen atoms.

$Ar_1$ and $Ar_2$ may be each, independently, one to five monocyclic arylene, bicyclic arylene, polycyclic arylene, monocyclic heteroarylene, bicyclic heteroarylene or polycyclic heteroarylene groups, either fused or linked. As used here, "fused" means that the one to five arylene or heteroarylene groups are fused into a single polycyclic moiety. As used here, "linked" means that the one to five arylene or heteroarylene groups are linked in a series of repeated arylene or heteroarylene moieties.

In some embodiments, $Ar_1$ and $Ar_2$ are the same. In some embodiments $Ar_1$ and $Ar_2$ are different.

In principle, $Ar_1$ may be any substituted or unsubstituted arylene or heteroarylene group, so long as it contains one available position to connect to the polymer chain, and one position having a substituent $R_1$ or available to incorporate a substituent $R_1$. In principle, $Ar_2$ may be any substituted or unsubstituted arylene or heteroarylene group so long as it contains two available positions for incorporation into the polymer backbone.

In some embodiments, $Ar_1$ and $Ar_2$ may be, independently, a 5-membered heteroarylene ring. In some embodiments, $Ar_1$ and $Ar_2$ may be, independently, two linked 5-membered heteroarylene rings. In some embodiments, $Ar_1$ and $Ar_2$ may be, independently, a 6-membered arylene or heteroarylene ring. In some embodiments, $Ar_1$ and $Ar_2$ may be, independently, a 6-membered arylene or heteroarylene ring fused to a 5-membered heteroarylene ring. In some embodiments, $Ar_1$ and $Ar_2$ may be, independently, a 6-membered arylene or heteroarylene ring fused to a 6-membered arylene or heteroarylene ring. In some embodiments, $Ar_1$ and $Ar_2$ may be, independently, a 5-membered heteroarylene ring fused to a 5-membered heteroarylene ring. In some embodiments, $Ar_1$ and $Ar_2$ may be, independently, three fused 6-membered arylene or heteroarylene rings. In some embodiments, $Ar_1$ and $Ar_2$ may be, independently, two fused 6-membered arylene or heteroarylene rings fused to a 5-membered heteroarylene ring. In some embodiments, $Ar_1$ and $Ar_2$ may be, independently, a 6-membered arylene or heteroarylene ring fused to two 5-membered heteroarylene rings.

In some embodiments, $Ar_1$ and $Ar_2$ may be, independently, a substituted or unsubstituted arylene hydrocarbon. In some embodiments, $Ar_1$ and $Ar_2$ may be, independently, a heteroarylene group containing 1, 2, 3, or 4 nitrogen atoms. In some embodiments, $Ar_1$ and $Ar_2$ may be, independently, a heteroarylene group containing 1, 2, 3, or 4 sulfur atoms. In some embodiments, $Ar_1$ and $Ar_2$ may be a heteroarylene group containing at least one (e.g. 1, 2, 3, 4, or more) oxygen atom. In some embodiments, $Ar_1$ and $Ar_2$ may be a heteroarylene group containing at least one (e.g. 1, 2, 3, 4 or more) nitrogen atom and at least one (e.g. 1, 2, 3, 4 or more) sulfur atom. In some embodiments, $Ar_1$ and $Ar_2$ may be a heteroarylene group containing at least one (e.g. 1, 2, 3, 4, or more) nitrogen atom and at least one (e.g. 1, 2, 3, or 4) oxygen atom. In some embodiments, $Ar_1$ and $Ar_2$ may be a heteroarylene group containing at least one (e.g. 1, 2, 3, 4, or more) selenium atom. In some embodiments, $Ar_1$ and $Ar_2$ may be a heteroarylene group containing at least one (e.g. 1, 2, 3, 4, or more) nitrogen atom and at least one (e.g. 1, 2, 3, 4, or more) selenium atom.

Examples of suitable $Ar_1$ and $Ar_2$ moieties include, but are not limited to, the following:

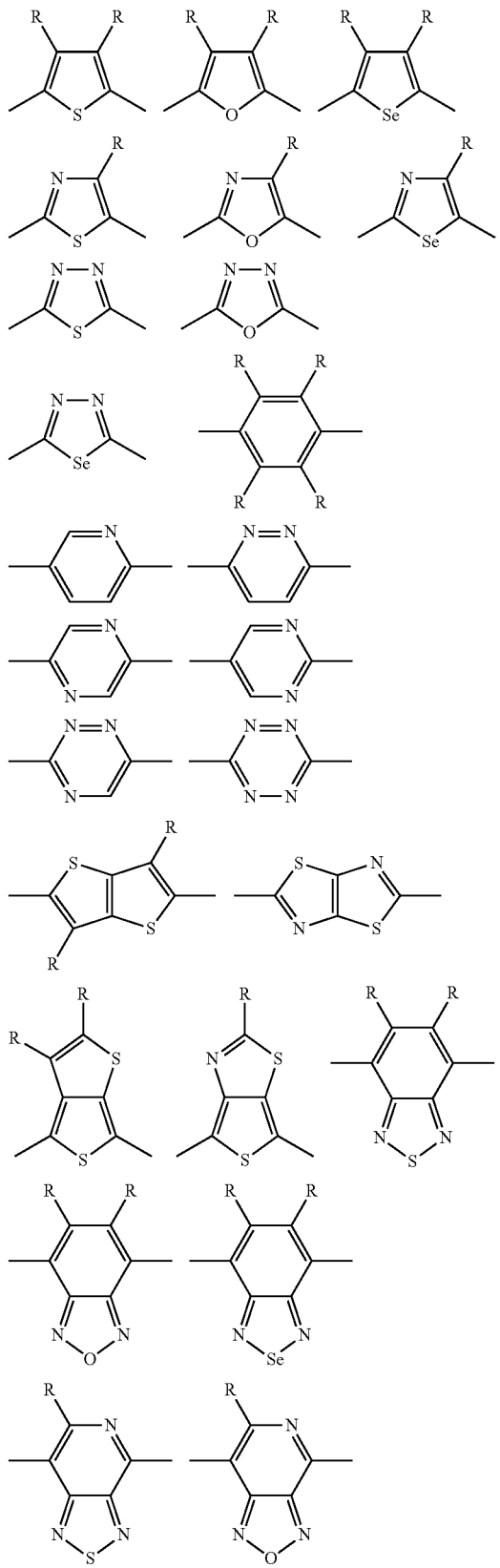

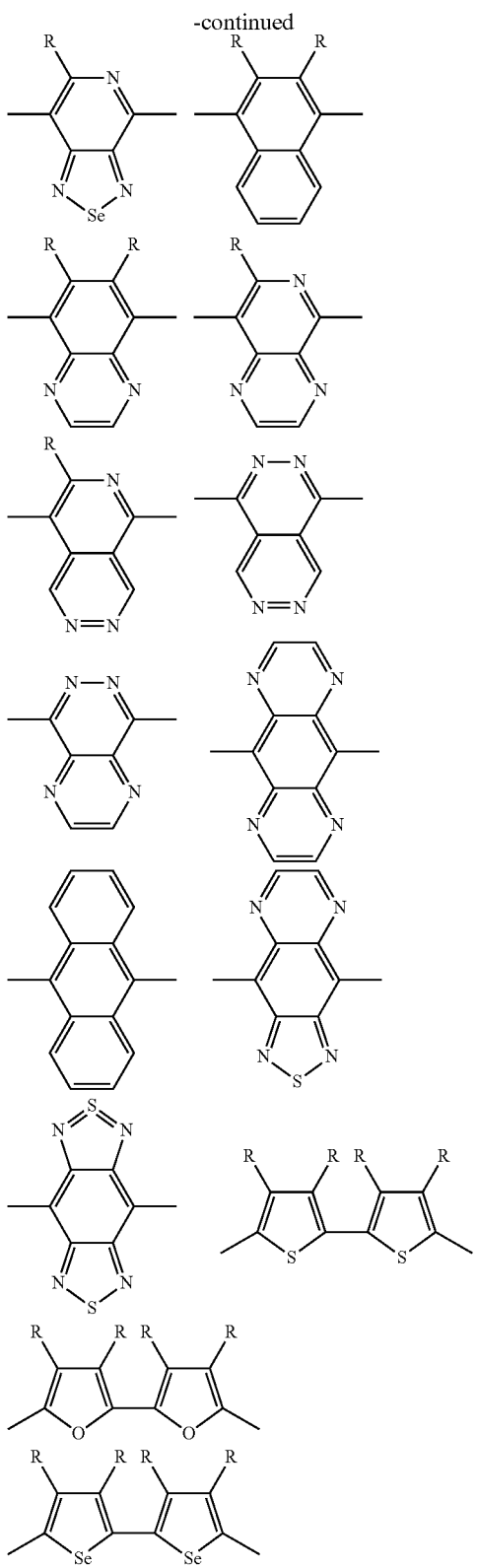

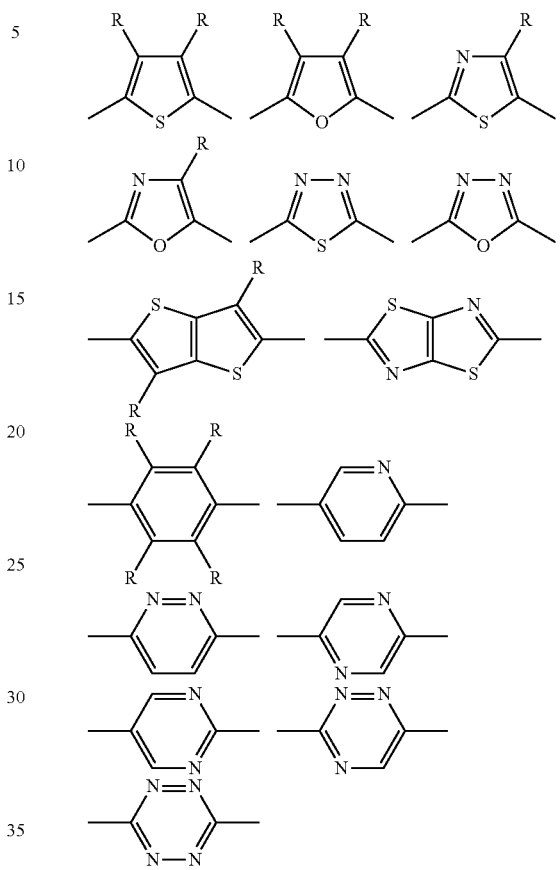

In the above structures, R is proton or fluorine atom or CF$_3$ or CN or NO$_2$ or alkyl group with carbon atom number of 1-18.

Some embodiments of polymers of formula (I) are have repeated units where R$_1$, R$_2$, and R$_3$ are alkyl groups with carbon atom number of 4-18, X is selected from Oxygen, Sulfur, Selenium and Nitrogen atoms, and Ar$_1$ and Ar$_2$ may be, independently:

where R is a proton or fluorine atom or CF$_3$ or CN or NO$_2$ or alkyl group with carbon atom number of 1-18. In some embodiments, one of Ar$_1$ and Ar$_2$ is thiophene. In some embodiments, both Ar$_1$ and Ar$_2$ are thiophene.

In some embodiments, the polymer of formula (I) has repeated units of formula (II), where R$_1$ and R$_3$ are alkyl groups with carbon atom number of 6-12, R$_2$ is proton, Ar$_1$ and Ar$_2$ are thiophene, and X is sulfur.

(II)

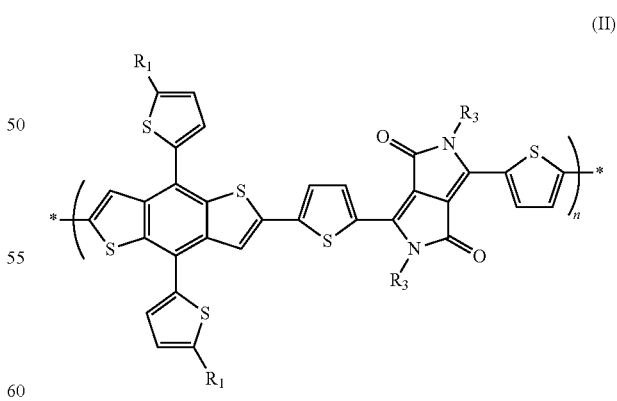

The number average molecular weight of the polymer may be in the range of about 1000 to about 1,000,000 for some embodiments, with some embodiments having a number average molecular weight in the range of about 5000 to about 500,000, and further embodiments having a number average molecular weight in the range of about 20,000 to about 200,000. It will be appreciated that molecular weight can be varied to optimize polymer properties. For example, lower molecular weight is preferred to ensure solubility, while a higher molecular weight is preferred to ensure good film-forming property.

Polymer Preparation

The polymers of the invention can be generally synthesized by co-polymerizing monomers having the structure of formula (III) and formula (IV),

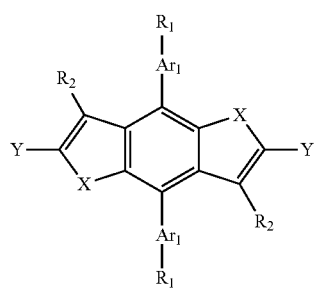

(III)

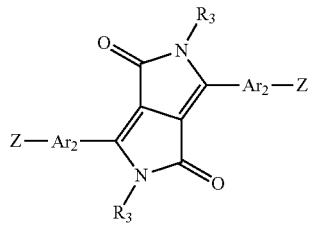

(IV)

where $R_1$, $R_2$, $R_3$, $Ar_1$, $Ar_2$ and X are as defined above; Y is dependently selected on Z. If Y is selected from boronic acid group, or boric acid esters groups including, but not being limited to, 1,3,2-dioxaborinane-2-yl, 4,4,5,5-tetramethyl-1,3,2-dioxaborolane-2-yl, and 5,5-dimethyl-1,3,2-dioxaborinane-2-yl, or magnesium halide groups including magnesium chloride, magnesium bromide, and magnesium iodide, or zinkhalide groups including zinkchloride and zinkbromide, or trialkyltin groups including, but not being limited to, trimethyl tin, triethyl tin, and tributyl tin, Z should be selected from I, Br, or Cl, and if Y is selected from I, Br, or Cl, Z should be selected from boronic acid group, or boric acid esters groups including, but not being limited to, 1,3,2-dioxaborinane-2-yl, 4,4,5,5-tetramethyl-1,3,2-dioxaborolane-2-yl, and 5,5-dimethyl-1,3,2-dioxaborinane-2-yl, or magnesium halide groups including magnesium chloride, magnesium bromide, and magnesium iodide, or zinkhalide groups including zinkchloride and zinkbromide, or trialkyltin groups including, but not being limited to, trimethyl tin, triethyl tin, and tributyl tin.

A polymerization route of the polymers in the patent using monomers as mentioned in formula (III) and (IV) is shown as the following scheme.

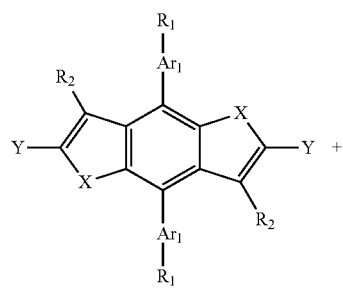

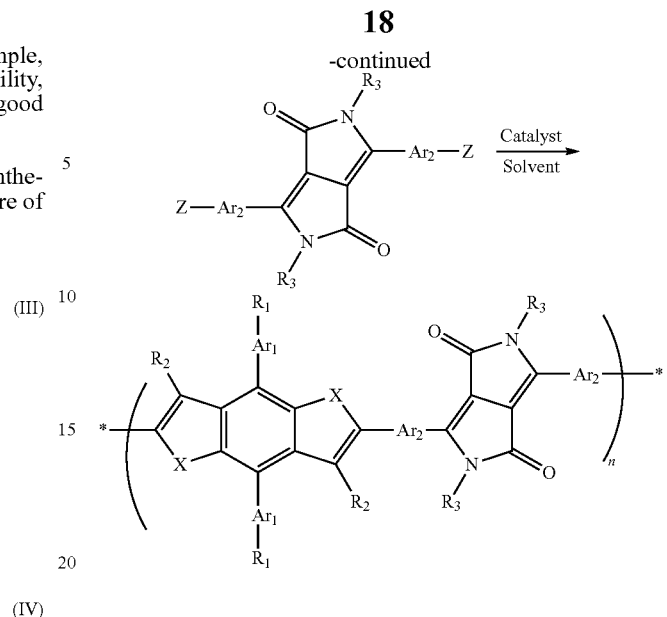

where $R_1$, $R_2$, $R_3$, $Ar_1$, $Ar_2$, X, Y and Z are as defined above.

If the condensation polymerization reaction is conducted between a dimagnesiohalo-arene compound and an arene dihalide compound, the polymerization reaction is a typical 'McCullough method', as reported by McCullough and Lowe [*J. Chem. Soc., Chem. Commun.* 1992, 70]. In McCullough method, THF is used as a solvent commonly, and a mixture of toluene and THF can also be used sometimes. Some catalysts containing Pd or Ni, preferably [1,3-bis(diphenylphosphino)propane]dichloronickel(II) and tetrakis(triphenylphosphine)palladium(0), can be used as catalyst for this reaction, and the molar ratio between catalyst and starting material is in the range of 10-0.1%. The reaction can be conducted at about 10° C. to refluxing point of the solvent. Depending on the reactivities of the reactants, the polymerization may take 30 minutes to 24 hours. Dimagnesiohalo-arene used in this reaction can be prepared from Grignard metathesis reaction, as reported by Loewe and McCullough [*Macromolecules*, 2001, (34), 4324-4333], or reaction between arene dihalide and magnesium.

In some embodiments, arene dihalide and Dimagnesiohalo-arene used in 'McCullough method' for the polymers of the invention are arene dibromide and dimagnesiobromoarene.

If the condensation polymerization reaction is conducted between a dizinkhalo-arene compound and an arene dihalide compound, the polymerization reaction is a typical 'Rieke method', as reported by Chen and Rieke [*Synth. Met.* 1993, (60), 175.]. In this method, THF is used as a solvent commonly, and Some catalysts containing Pd or Ni, preferably [1,2-Bis(diphenylphosphino)ethane]dichloronickel(II), can be used as catalyst for this reaction, and the molar ratio between catalyst and starting material is in the range of 10-0.1%. The reaction is can be conducted at about 10° C. to refluxing point of the solvent. Depending on the reactivities of the reactants, the polymerization may take 30 minutes to 24 hours.

In some embodiments, arene dihalide and dizinkhaloarene used in 'Rieke method' for the polymers of the invention are arene dibromide and dizinkchloro-arene.

If the condensation polymerization reaction is conducted between a bis(trialkylstannyl)-arene compound and an arene dihalide, the polymerization reaction is a typical 'Stifle coupling method', as reported by Iraqi and Barker [*J. Mater. Chem.* 1998, (8) 25]. In this method, many kinds of solvents including, but not limited to, tetrahydrofuran (THF), Dimethyl Formamide (DMF), and toluene can be used as a solvent commonly, and Some catalysts containing Pd, preferably tetrakis(triphenylphosphine)palladium(0), can be used as catalyst for this reaction, and the molar ratio between catalyst and starting material is in the range of 10-0.1%. The reaction can be conducted at about 60° C. to refluxing point of the solvent. Depending on the reactivities of the reactants, the polymerization may take 1 to 72 hours.

In some embodiments, arene dihalide and dizinkhaloarene used in 'Stifle coupling method' for the polymers of the invention are arene dibromide and dizinkchloro-arene.

If the condensation polymerization reaction is conducted between an arene-diboronic acid compound or an arenediboric acid ester compound and an arene dihalide, the polymerization reaction is a typical 'Suzuki reaction', as reported by Miyaura and Suzuki [*Chemical reviews* 1995 (95): 2457-2483]. In this method, many kinds of solvents including, but not limited to, THF, and toluene can be used as a solvent commonly, and Some catalysts containing Pd, preferably tetrakis(triphenylphosphine)palladium(0), can be used as catalyst for this reaction, and the molar ratio between catalyst and starting material is in the range of 10-0.1%. The reaction can be conducted at about 60° C. to refluxing point of the solvent. Depending on the reactivities of the reactants, the polymerization may take 12 to 72 hours.

In some embodiments, arene dihalide used in 'Suzuki reaction' for the polymers of the invention is arene dibromide or dizinkchloro-arene.

Devices

Generally, the polymers of the invention are useful in any application wherein a conjugated polymer, particularly a conjugated photovoltaic polymer, would have utility. For example, the present polymers are suitable as the active materials in the following devices: thin film semiconductor devices such as solar cells, light emitting diodes, transistors, photodetectors, and photoconductors; electrochemical devices such as rechargeable batteries, capacitors, supercapacitors, and electrochromic devices, and sensors.

Semiconductive compositions may be prepared that comprise a polymer of the invention optionally combined with an admixer, such as a compound selected such that charge and/or energy transfer takes place between the admixer and the polymer when an excitation source including light or voltage is applied across the composition. For example, the admixer can be fullerene such as: $C_{60}$, $C_{70}$, or $C_{80}$, or some substituted fullerene compounds such as $PC_{60}BM$ ([6,6]-phenyl $C_{61}$ butyric acid methyl ester) and $PC_{71}BM$ ([6,6]-phenyl $C_{71}$ butyric acid methyl ester).

In some embodiments, polymers of the invention may be used as photovoltaic materials in photovoltaic devices such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present.

FIG. 1 is a schematic illustration of an electro-optic device 100 according to an embodiment of the current invention. The electro-optic device 100 has a first electrode 102, a second electrode 104 spaced apart from the first electrode 102, and an active layer 106 disposed between the first electrode and the second electrode. The electro-optic device 100 can have multiple layers of active materials and/or layers of material between the electrodes and the active layer such as the layer 108, for example. The active layer can include a conjugated polymer material according to one or more embodiments of the current invention. One or both of the electrodes 102 and 104 can be transparent electrodes in some embodiments of the current invention.

FIG. 3 is a schematic illustration of polymer solar cell device according to a specific embodiment of the current invention. The device in FIG. 3 has a first electrode Ca/Al, a second electrode PEDOT/ITO spaced apart from the first electrode, and an active layer LT13:$PC_{71}BM$ disposed between the first electrode and the second electrode. The active layer can include a conjugated polymer material according to one or more embodiments of the current invention. One or both of the electrodes can be other metals, electrolytes and transparent electrodes in some embodiments of the current invention.

The schematic illustrations of FIGS. 1 and 3 are shown as examples. Devices according to other embodiments of the current invention are not limited to these specific examples.

Tandem Devices

In some embodiments, the device is a tandem device having more than one active layer. In some embodiments, the tandem device may be an inverted tandem device.

FIG. 2 is a schematic illustration of a tandem electro-optic device 200 according to an embodiment of the current invention. The electro-optic device 200 has a first electrode 202, a second electrode 204 spaced apart from the first electrode 202, and an active layer 206 disposed between the first electrode and the second electrode. This embodiment is an example of a tandem electro-optic device that has a second active layer 210 between the first electrode 202 and the second electrode 204. The electro-optic device 200 can have additional layers of material between the active layers and the electrodes and/or between the two active layers. For example, there could be a layer 208 between the active layers 206 and 210. Devices according to the current invention are not limited to only one or two active layers; they may have multiple active layers in some embodiments of the current invention.

FIG. 4 is a schematic illustration of tandem polymer solar cell device according to another embodiment of the current invention. Based on FIG. 3, a device with multiple active layers with/without thin interfacial layers between different layers of active materials is illustrated. For example, a tandem photovoltaic cell that has two or more active layers with thin interfacial layers. FIG. 4A is an inverted structure and FIG. 4B is a conventional structure for a tandem solar cell. The schematic illustrations of FIGS. 2 and 4 are shown as examples. Devices according to other embodiments of the current invention are not limited to these specific examples.

Although the photoactive materials play a critical role in determining the PCE, there have been no reports so far on designing photoactive materials for high efficiency tandem PSCs. To be applied in a tandem structure effectively, there are several requirements for rear cell low bandgap (LBG) polymers. First, a small energy bandgap (<1.5 eV) is critical so that the overlap of absorptions between the front cell and rear cell can be minimized (Dennler et al., *Adv. Mater.*, vol. 20, p. 579, 2008). Second, fine-tuning of the highest occupied molecular orbital (HOMO) and the lowest unoccupied molecular orbital (LUMO) levels is required to achieve high open circuit voltage ($V_{OC}$) with a small bandgap while maintaining a proper LUMO level for efficient charge separation (Huo et al., *Angew. Chem. Int. Ed.*, vol. 49, p. 1500, 2010; Scharber et al., *Adv. Mater.*, vol. 18, p. 789, 2006. Third, high charge carrier mobility and fine phase separation with the acceptor are required for high short circuit current ($J_{SC}$) and fill factor (FF) in single cell devices (Bijleveld et al., *J. Am. Chem. Soc.*, vol. 131, p. 16616, 2009). Since the two cells are connected in series, the total current will be limited by the sub-cell with the lower current. Obtaining high current in the rear cell is a challenge because part of the incident light will have already been absorbed by the front cell, so the current it can provide will be lower than in a single cell device. Therefore, a carefully designed LBG polymer will be suitable for tandem cells only if it can achieve high current by efficiently utilizing the low energy (<2 eV) portion of the solar spectrum.

LBG conjugated polymer poly{2,6'-4,8-di(5-ethylhexylthienyl)benzo[1,2-b;3,4-b]dithiophene-alt-5-dibutyloctyl-3,6-bis(5-bromothiophen-2-yl)pyrrolo[3,4-c]pyrrole-1,4-dione} (PBDTT-DPP, FIG. 9A) and similar polymers are advantageous for tandem solar cells. To achieve a small bandgap, a polymer backbone based on the diketopyrrolopyrrole (DPP) unit and benzodithiophene (BDT) may be used, inspired by a previous LBG polymer which had a promising bandgap of 1.3 eV, but a rather disappointing photovoltaic performance (poly{2,60-4,8-dioctyloxybenzo[1,2-b;3,4-b]dithiophene-alt-5-diethylhexyl-3,6-bis(5-bromothiophen-2-yl)pyrrolo[3,4-c]pyrrole-1,4-dione} or PBDT-DPP) (Huo et al., *Macromolecules*, vol. 42, p. 6564, 2009). By replacing the oxygen atoms attached to the BDT unit with thiophenes to form the thienylbenzodithiophene (BDTT) unit, the HOMO and LUMO levels of PBDTT-DPP may be moved deeper which increases the $V_{OC}$, while keeping the bandgap within the ideal range, without losing the driving force for efficient charge separation (L. J. Huo, J. H. Hou, S. Q. Zhang, H. Y. Chen, Y. Yang, *Angew. Chem. Int. Ed*, 49, 1500 (2010).

In some embodiments, bulkier side chains, such as, for example, 2-ethylhexyl side chains on BDTT and bulkier side chains on DPP may be used to increase the solubility of the resulting polymers and thus obtain much higher molecular weights. Compared to PBDT-DPP, PBDTT-DPP has better solubility, higher molecular weight and higher carrier mobility, which leads to a higher $J_{SC}$ in single cell devices. PCEs of 7% were achieved in single cell devices with both a regular (Yu et al., *Science*, vol. 270, p. 1789, 1995) and an inverted (Li et al., *Applied Physics Letters*, vol. 88, p. 253503, 2006) structure. Finally, using this LBG polymer in the inverted structure of a tandem solar cell (FIG. 11B) achieved a PCE as high as 9.5%, which is the highest efficiency reported to date for organic photovoltaic devices.

EXAMPLES

Experimental

The practice of the present invention can employ conventional techniques of polymer chemistry, which are within the skill of the art. In the following examples, efforts have been made to ensure accuracy with respect to numbers used, including amounts, temperature, reaction time, etc., but some experimental error and deviation should be accounted for. Temperature used in the following examples is in degrees C., and the pressure is at or near atmospheric. All solvents were purchased as HPLC grade, and all reactions were routinely conducted under an inert atmosphere of argon. All regents were obtained commercially unless otherwise indicated.

Example 1

Synthesis

Synthesis of poly(4,8-bis(5-ethylhexyl-2-thienyl)-benzo[1,2-b:4,5-b']dithiophene)-alt-(2,5-Dibutyloctyl-3,6-bisthiophen-2-yl-pyrrolo[3,4-c]pyrrole-1,4-dione), LT13

Synthesis route of this polymer, LT13 is shown in the following scheme.

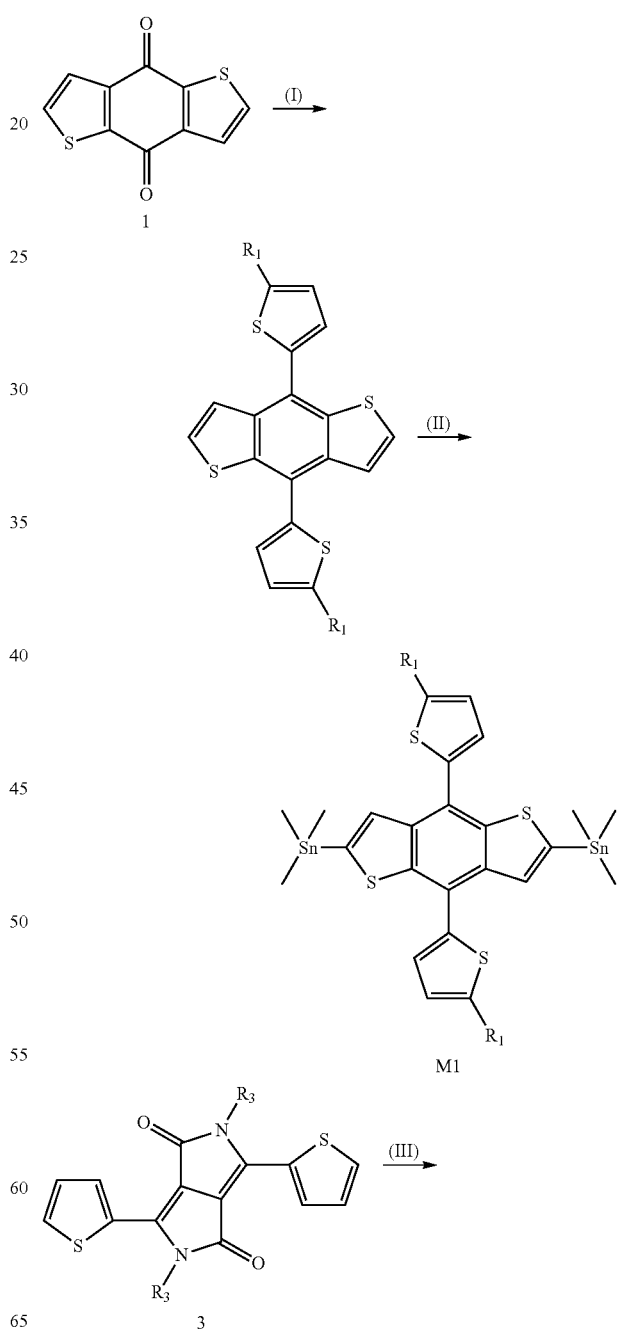

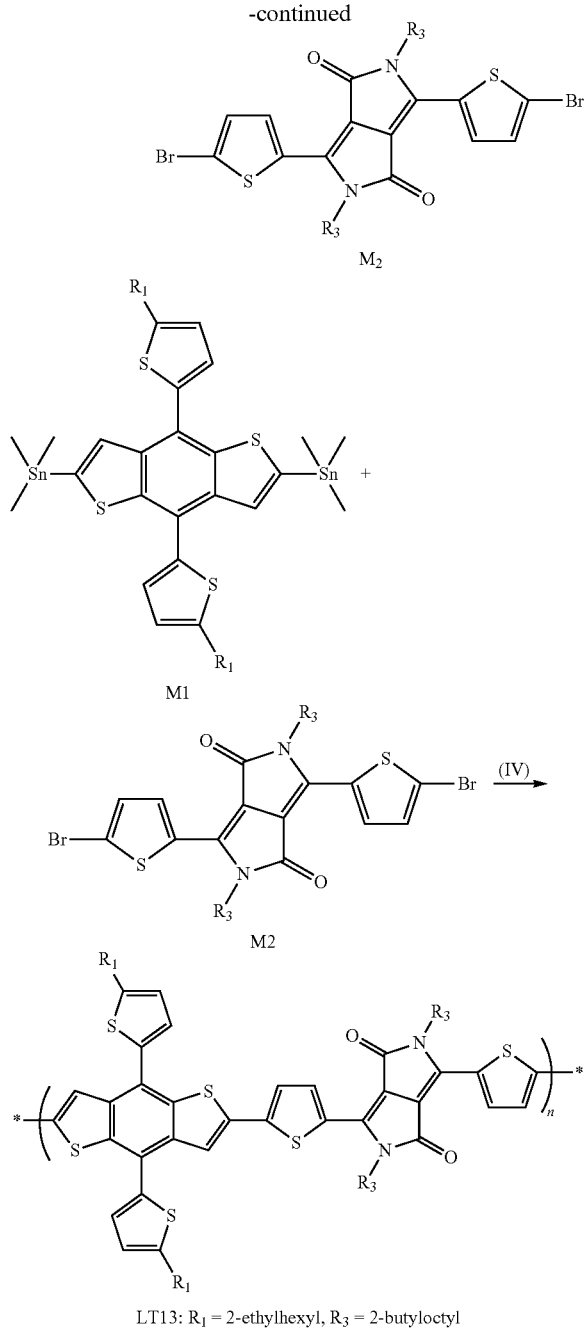

LT13: R₁ = 2-ethylhexyl, R₃ = 2-butyloctyl 4,8-bis(5-decyl-2-thienyl)-benzo[1,2-b:4,5-b']dithiophene (2). Under the protection of argon, n-butyllithium (2.88 M, 11.4 mL) was added dropwise to 2-decylthiophene (6.73 g, 30.0 mmol) in THF (30 mL) at 0° C.; then the mixture was warmed up to 50° C. and stirred for 1 h. Subsequently, 4,8-dehydrobenzo[1,2-b:4,5-b']dithiophene-4,8-dione (1.76 g, 8.0 mmol) was added, and the mixture was stirred for 1 h at 50° C. After cooling down to ambient temperature, SnCl₂.2H₂O (13.5 g, 60 mmol) in 10% HCl (20 mL) was added, and the mixture was stirred for an additional 1.5 h and poured into ice water. The mixture was extracted by diethyl ether twice, and the combined organic phase was concentrated. Further purification was carried out by column chromatography using petroleum ether as eluent to obtain pure 2 as a light yellow solid (3.0 g, yield 59.0%).

2,6-Bis(trimethyltin)-4,8-bis(5-decyl-2-thienyl)-benzo[1,2-b:4,5-b']dithiophene (M1). Under the protection of argon, n-butyllithium (2.88 M, 1.30 mL) was added dropwise to compound 2 (0.942 g, 1.48 mmol) in THF (20 mL) at room temperature and stirred for 2 h at 50° C. Then trimethyltin chloride in hexane (1.0 M, 4.5 mL) was added in one portion at room temperature. After 6 h, the reaction was stopped and water (20 mL) was added, and then the mixture was extracted by diethyl ether twice. After removing the solvent, the residue was purified by recrystallization from hot ethanol to obtain pure M1 as a yellow solid (1.05 g, yield 73.9%).

2,5-Dibutyloctyl-3,6-bis(5-bromothiophen-2-yl)pyrrolo[3,4-c]-pyrrole-1,4-dione (M2). Compound 3 (0.772 g, 1.21 mmol) and Nbromosuccinimide (0.431 g, 2.42 mmol) were dissolved into chloroform (20 mL) in a two-neck round flask under argon protection, and then the solution was protected from light and stirred at room temperature. After 40 h, the mixture was poured into 200 mL of methanol and then filtered. The filter cake was washed by hot methanol twice. After drying in vacuum, the pure product (M2) was obtained as a purple-black solid (0.85 g, yield 88%).

M1 (0.2360 g, 0.2456 mmol) and compound M2 (0.1952 g, 0.2456 mmol) were dissolved into 8 mL toluene and 1.5 mL DMF in a flask protected by argon. The solution was flushed by argon for 10 minutes, then 10 mg of Pd(PPh₃)₄ was added into the flask. The solution was flushed by argon again for 20 minutes. The oil bath was heated to 110° C. gradually, and the reactant was stirred for 10 hours at 110° C. under argon atmosphere. Then, the reactant was cooled down to room temperature and the polymer was precipitated by addition of 100 ml methanol, and the precipitated solid was collected and purified by Soxhlet extraction. The title polymer was obtained as dark purple solid, yield 30%.

Figure 5:
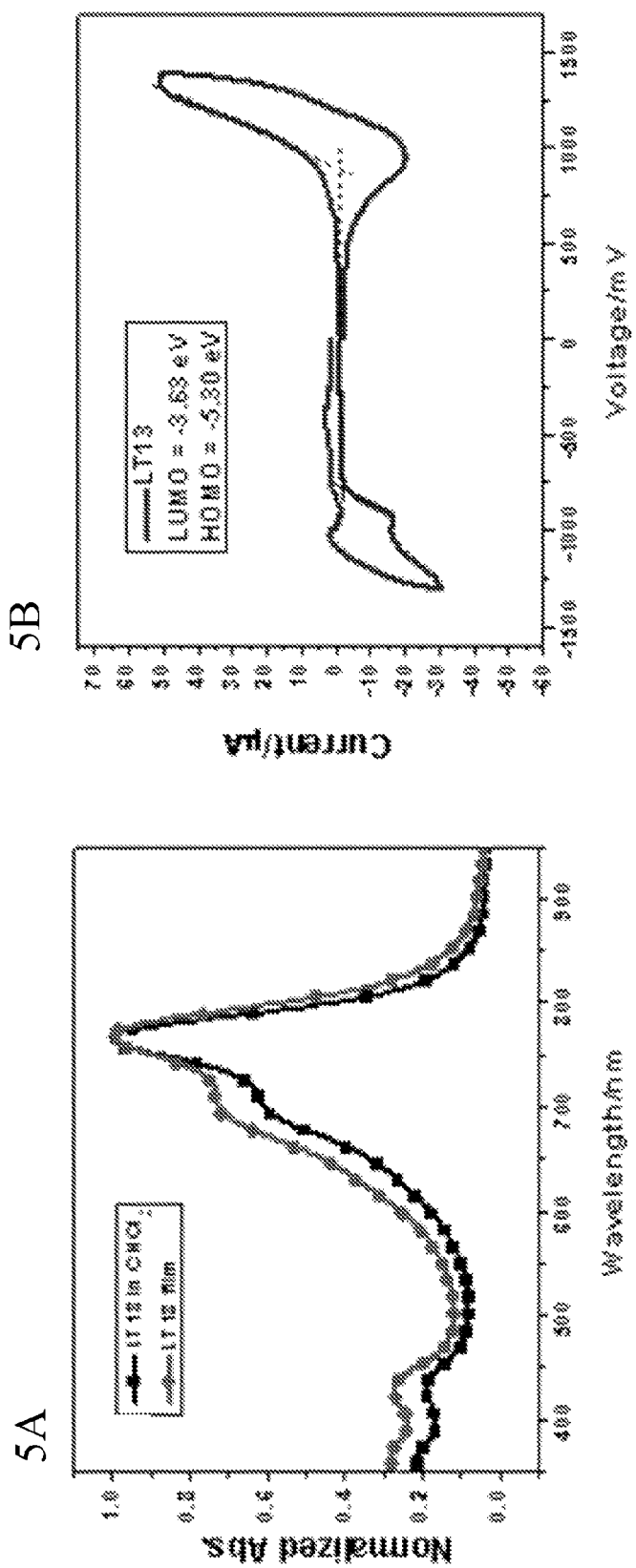
FIG. 5 shows properties of a polymer according to one embodiment of the invention.

FIG. 5 shows the UV-vis absorption spectrum (FIG. 5A) in CHCl₃ and film and electrochemical cyclic voltammetry spectrum (FIG. 5B) of LT13. The molecular weight (Mn) of LT13 was found to be 40.7 k.

Example 2

Fabrication and Characterization of Polymer Solar Cell Device

The polymer, LT13, (30 mg) was dissolved in chlorobenezene to make 7.5 mg ml⁻¹ solution, followed by blending with PC₇₁BM (60 mg).

Polymer solar cell devices were fabricated on a transparent, indium-tin oxide (ITO) coated glass substrate. A thin layer of a conducting polymer, poly(styrenesulfonate) doped poly(3,4-ethylenedioxy-thiophene) (PEDOT:PSS), was spin-coated onto the ITO surface for a better interface. The thickness of the PEDOT:PSS layer was about 30 nm, measured with Dektek profilometer. Then, a thin layer was spin-coated using the solution prepared above. Then, thin layers of calcium and aluminum were evaporated successively at pressure around 10⁻⁴ Pa. Testing was performed in a N₂ filled glove box under AM 1.5 G irradiation (100 mW cm⁻²) using a Xenon lamp solar simulator calibrated with a silicon diode (with KG5 visible filter) calibrated in National Renewable Energy Laboratory (NREL).

Figure 6:
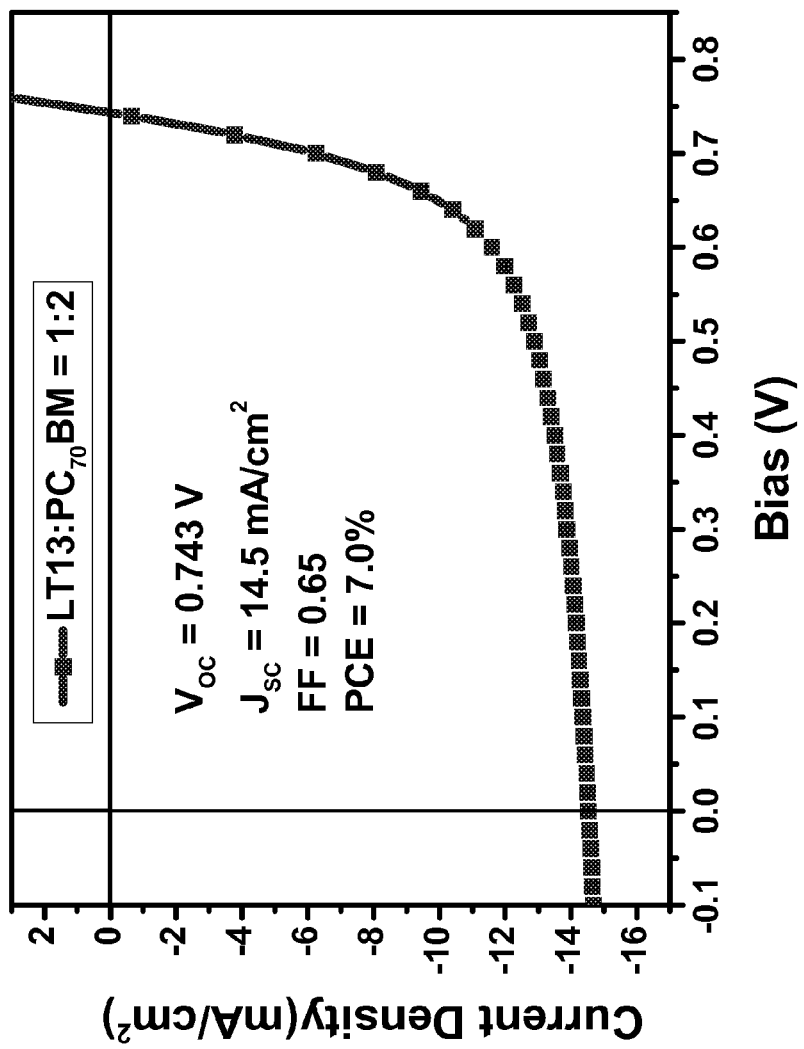
FIG. 6 shows I-V curve of a polymer solar cell according to one embodiment of the invention under simulated sunlight (AM 1.5, 100 mW/cm$^{-2}$) with a structure of ITO/PEDOT:PSS/LT13:PC$_{70}$BM (1:2 wt/wt)/Ca/Al.

FIG. 6 shows I-V curve data of a polymer solar cell device under simulated sunlight (AM 1.5, 100 mW/cm⁻²) with a structure of ITO.PEDOT:PSS/LT13:PCBM/Ca/Al according to an embodiment of the current invention. The power conversion efficiency of the best polymer solar cell device was 7.0%, with an open circuit voltage of 0.743 V, a short circuit current of 14.5 mA/cm⁻², and a fill factor of 65%.

Figure 7:
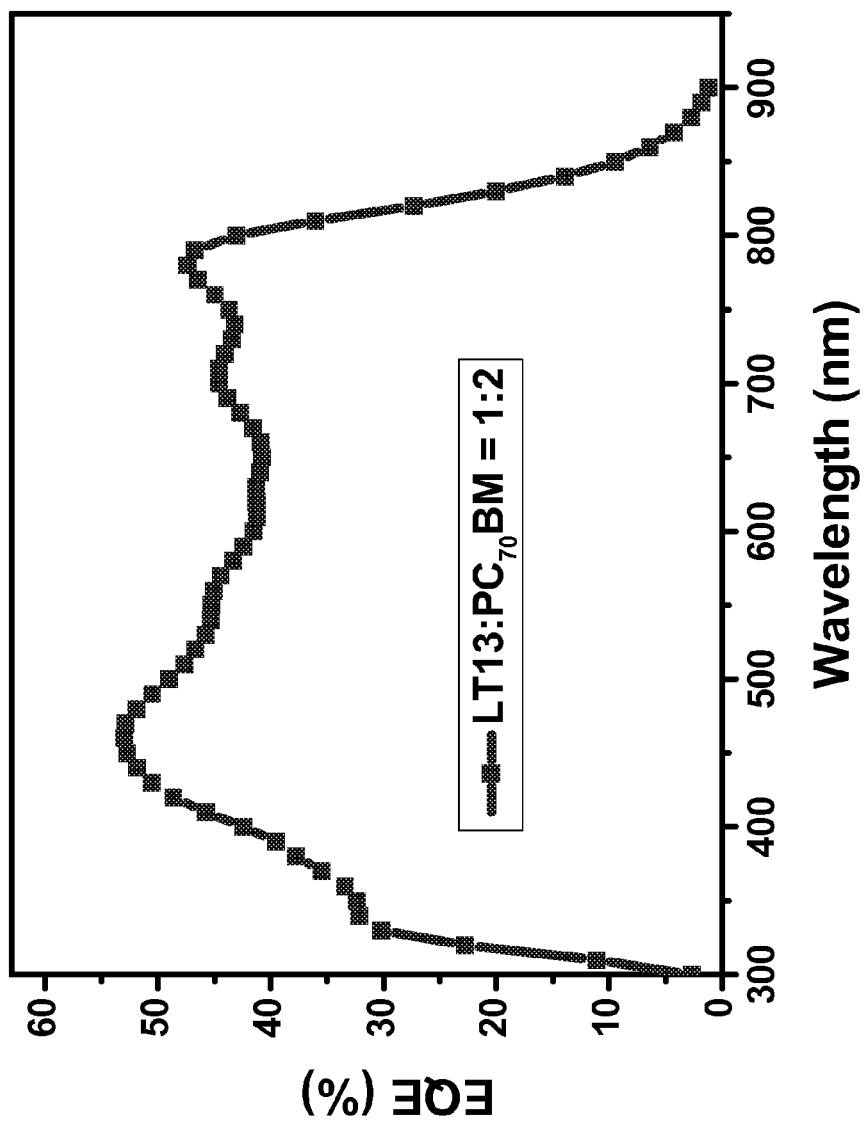
FIG. 7 shows EQE curve of a polymer solar cell according to one embodiment of the invention with a structure of ITO/PEDOT:PSS/LT13:PC$_{70}$BM (1:2 wt/wt)/Ca/Al. The devices efficiently harvest photons with wavelength from 300-900 nm.

FIG. 7 shows EQE data of a polymer solar cell device under simulated sunlight (AM 1.5, 100 mW/cm$^{-2}$) with a structure of ITO.PEDOT:PSS/LT13:PCBM/Ca/Al according to an embodiment of the current invention. These devices efficiently harvest photons with wavelength from 350~800 nm.

Example 3

Fabrication and Characterization of Polymer Tandem Solar Cell Device

Photovoltaic cells were fabricated on indium tin oxide (ITO) coated glass substrates. A TiO$_2$:Cs solution prepared by blending 0.5 and 0.2 wt % solutions of TiO$_2$ and Cs$_2$CO$_3$ in a 1:1 volume ratio was spin-casted at 3000 rpm for 30 s, and the thermal annealing was performed at 80° C. for 20 min. The poly(3-hexylthiophene) (P3HT):Indene-C$_{60}$ bisadduct (ICBA) (P3HT:ICBA) at a 1:0.7 weight ratio in 1% chloroform solution was spin-casted at 4000 rpm for 30 s. A modified PEDOT:PSS layer was spin-casted at 4000 rpm for 60 s on top of the P3HT:ICBA layer. Another thin layer of TiO$_2$:Cs was spin-coated and then a layer of LT13:PC$_{71}$BM was spin-coated. Finally, the device fabrication was completed by thermal evaporation of 80 nm Al as the cathode.

Figure 8:
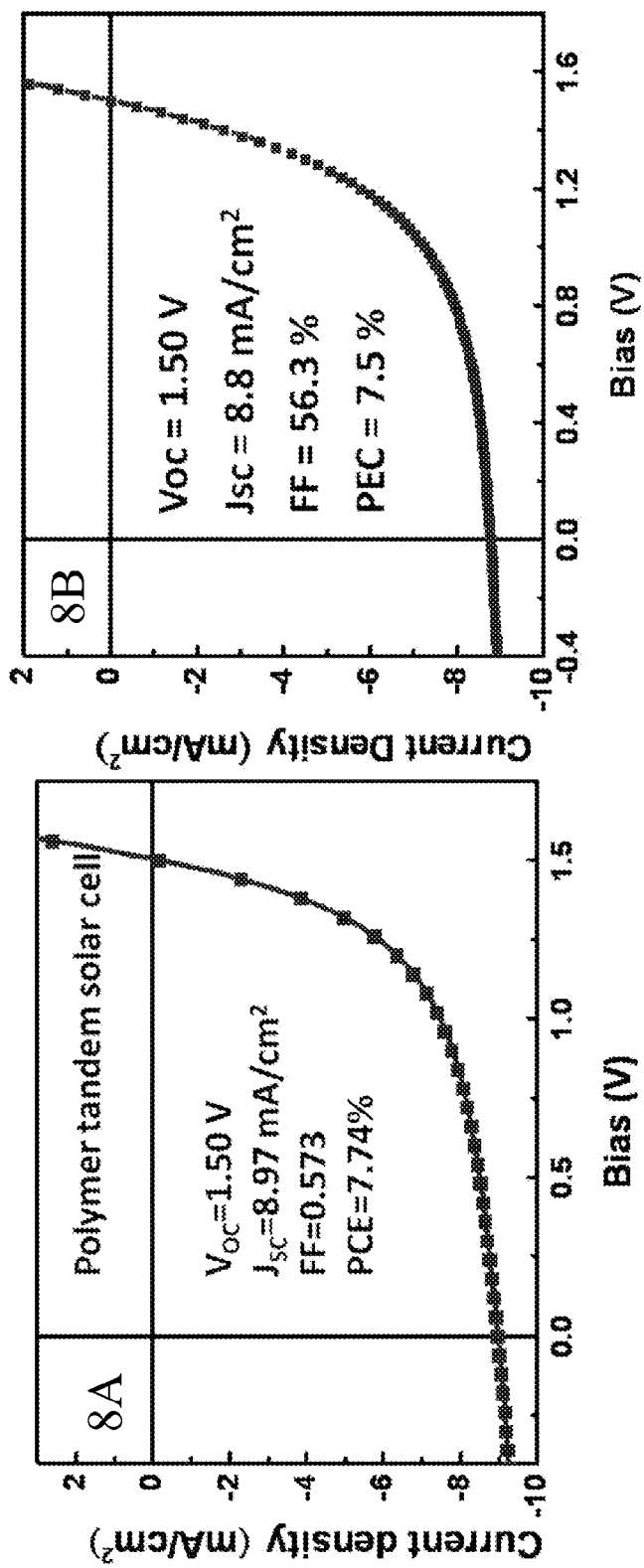
FIG. 8 shows I-V curve of a polymer tandem solar cell device according to one embodiment of the invention under simulate sunlight (AM 1.5, 100 mW/cm$^{-2}$) with a structure of ITO/TiO$_2$:Cs/P3HT:ICBA/PEDOT:PSS/TiO$_2$:Cs/LT13:PC$_{70}$BM/Ca/Al (a) and ITO/PEOT:PSS/P3HT:ICBA/TiO2/LT13:PC70BM/Ca/Al (b).

FIG. 8A shows I-V curve data of a inverted polymer tandem solar cell device under simulated sunlight (AM 1.5, 100 mW/cm$^{-2}$) according to an embodiment of the current invention. The power conversion efficiency of the best polymer tandem solar cell device was 7.7%, with an open circuit voltage of 1.504 V, a short circuit current of 8.97 mA/cm$^{-2}$, and a fill factor of 57.3%. FIG. 8B shows I-V curve data of a conventional polymer tandem solar cell device under simulate sunlight (AM 1.5, 100 mW/cm$^{-2}$) according to an embodiment of the current invention. The power conversion efficiency of the best polymer tandem solar cell device was 7.5%, with an open circuit voltage of 1.50 V, a short circuit current of 8.8 mA/cm$^{-2}$, and a fill factor of 56.3%.

Example 4

Materials:
poly {2,6'-4,8-di(5-ethylhexylthienyl)benzo[1,2-b;3,4-b]dithiophene-alt-5-dibutyloctyl-3,6-bis(5-bromothiophen-2-yl)pyrrolo[3,4-c]pyrrole-1,4-dione} (PBDTT-DPP or LT13) and Indene-C$_{60}$ bisadduct (ICBA) were synthesized. Poly(3-hexylthiophene) (P3HT) was purchased from Riekemetal. [6,6]-phenyl-C$_{71}$-butyric acid methyl ester (PC$_{71}$BM) was purchased from Nano-C. Otherwise stated, all of the chemicals are purchased from Aldrich and used as received.

Methods.

Materials Characterization: $^1$H and $^{13}$C NMR spectra were measured on a Bruker arx-400 spectrometer. Absorption spectra were taken on a Varian Cary 50 ultraviolet-visible spectrometer. The molecular weight of polymers was measured by the GPC method, and polystyrene was used as a standard by using chloroform as eluent. TGA measurement was performed on a Perkin-Elmer TGA-7. X-ray diffraction experiments were carried out using PANalytical X'Pert Pro X-ray Powder Diffractometer using Cu—Ka radiation (λ=1.54050 Å). The polymer films for XRD measurements were coated from a polymer chloroform solution, ca. 5 mg/mL on silicon substrates. The electrochemical cyclic voltammetry (CV) was conducted with Pt disk, Pt plate, and Ag/AgCl electrode as working electrode, counter electrode, and reference electrode, respectively, in a 0.1 mol/L tetrabutylammonium hexafluorophosphate (Bu$_4$NPF$_6$) acetonitrile solution. The polymer films for electrochemical measurements were coated from a polymer chloroform solution, ca. 5 mg/mL. For calibration, the redox potential of ferrocene/ferrocenium (Fc/Fc+) was measured under the same conditions, and it is located at 0.42 V to the Ag/AgCl electrode. It is assumed that the redox potential of Fc/Fc+ has an absolute energy level of −4.80 eV to vacuum. The energy levels of the highest (HOMO) and lowest unoccupied molecular orbital (LUMO) were then calculated according to the following equations $$HOMO = -e(E_{ox}+4.38)(eV)$$

$$LUMO = -e(E_{red}+4.38)(eV)$$

where $E_{ox}$ is the onset oxidation potential vs Ag/AgCl and $E_{red}$ is the onset reduction potential vs Ag/AgCl.

Hole mobility was measured using space charge limited current model (SCLC), using a diode configuration of ITO/PEDOT:PSS/polymer/Au by taking current-voltage current in the range of 0-2 V and fitting the results to a space charge limited form, where the SCLC is described by $$J = (8/9)\epsilon_0\epsilon_r\mu_e(V^2/L^3)$$

where $\epsilon_0$ is the permittivity of free space, $\epsilon_r$ is the dielectric constant of the polymer, $\mu$ is the hole mobility, V is the voltage drop across the device, L is the polymer thickness. The dielectric constant $\epsilon_r$ is assumed to be 3, which is a typical value for conjugated polymers. The thickness of the polymer films is measured by using Dektek profilometer.

Figure 9:
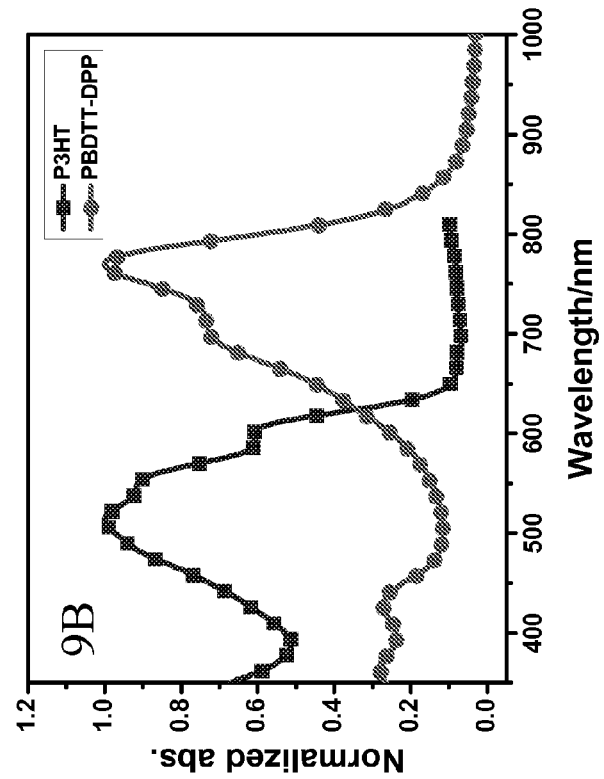
FIG. 9 shows a polymer according to one embodiment of the invention.
Figure 9:
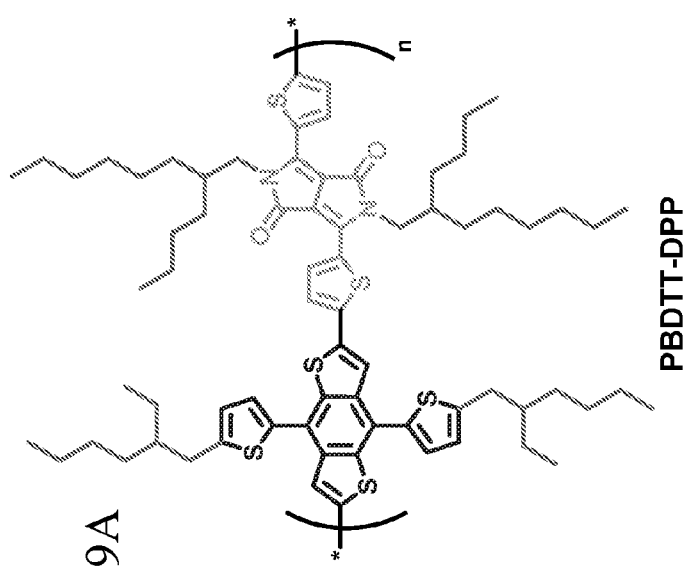
Figure 12:
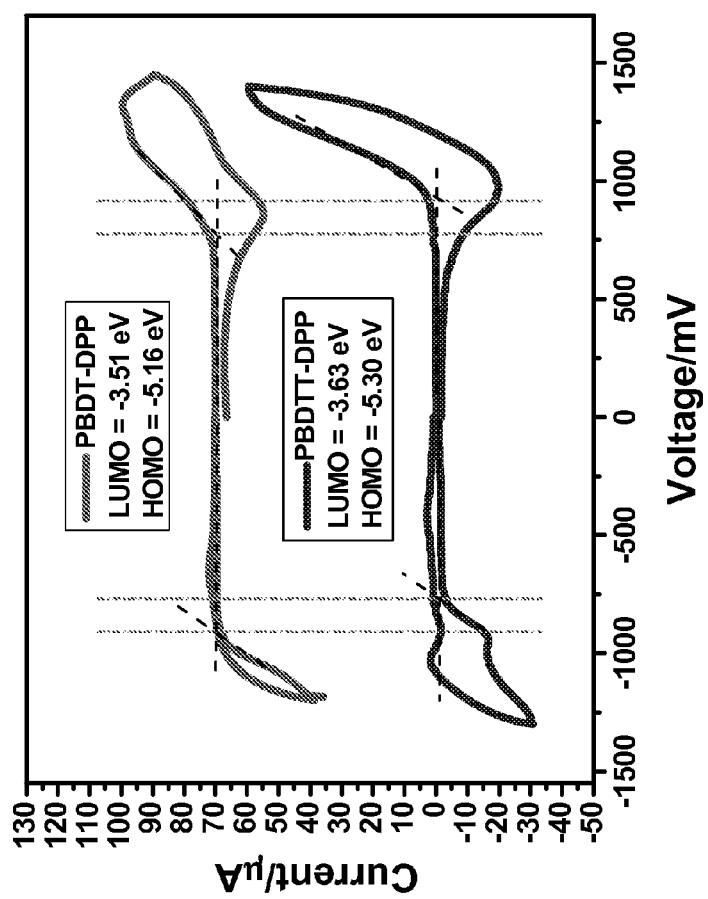
FIG. 12 shows electrochemical cyclic voltammogram of PBDT-DPP and PBDTT-DPP.

FIG. 9B shows the UV-visible absorption spectra of PBDTT-DPP and poly(3-hexylthiophene) (P3HT, Eg~1.9 eV) in the solid state. The absorption onset of PBDTT-DPP was at 858 nm, indicating an optical bandgap of 1.44 eV. Compared to the absorption spectra of P3HT, which is the most frequently used front cell material, the overlap of the spectra of these two materials is small, indicating a good match for the tandem structure. The HOMO and LUMO energy levels of PBDT-DPP and PBDTT-DPP were determined by cyclic voltammetry (CV) (Huo et al., *Macromolecules*, vol. 42, p. 6564, 2009); for details, please see supporting information (FIG. 12). The HOMO/LUMO of PBDTT-DPP were found to be −5.30/−3.63 eV, and −5.16/−3.51 eV for PBDT-DPP, as reported (Huo et al., *Macromolecules*, vol. 42, p. 6564, 2009). A much deeper HOMO was obtained for PBDTT-DPP, suggesting a higher V$_{oc}$ for BHJ solar cell devices blended with PC$_{71}$BM. The offset of the LUMO levels between PBDTT-DPP and PC$_{71}$BM was controlled to be slightly higher than the minimum value (ca. 0.3 eV) for efficient charge separation at the interface of the donor and acceptor (the LUMO for PC$_{71}$BM is −4.0 to −4.3 eV) (Cheng et al., *Chem. Rev.*, vol. 109, p. 5868, 2009).

Figure 13:
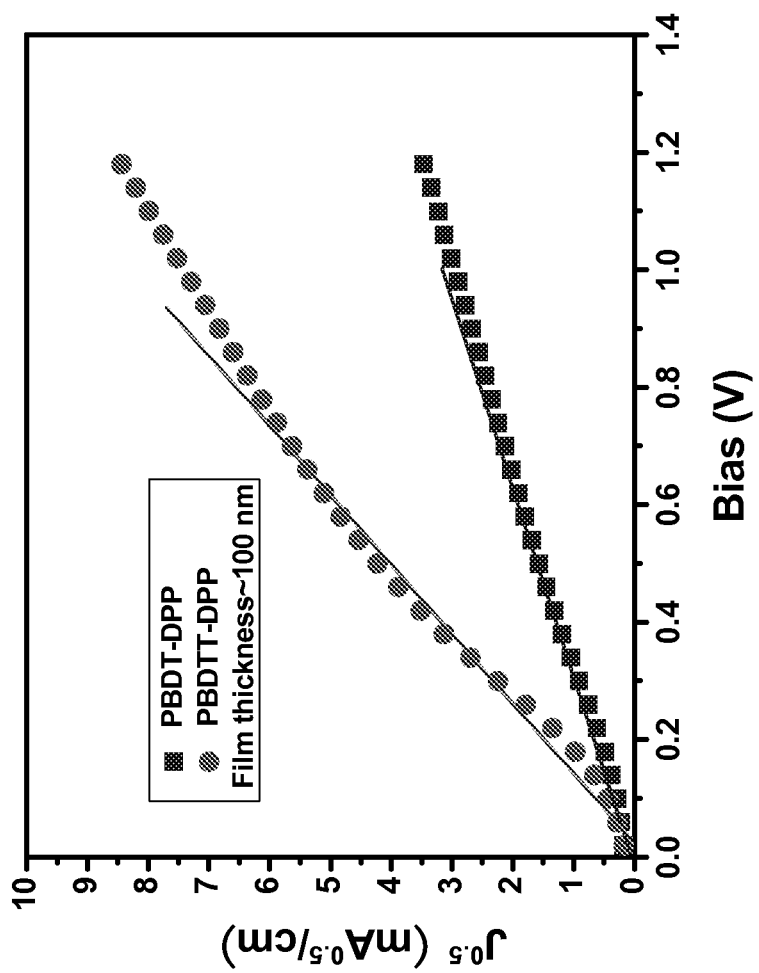
FIG. 13 shows $J^{0.5}$-V plots for the polymer film using SCLC model with device structure of ITO/PEDOT:PSS/Polymer/Au.
Figure 14:
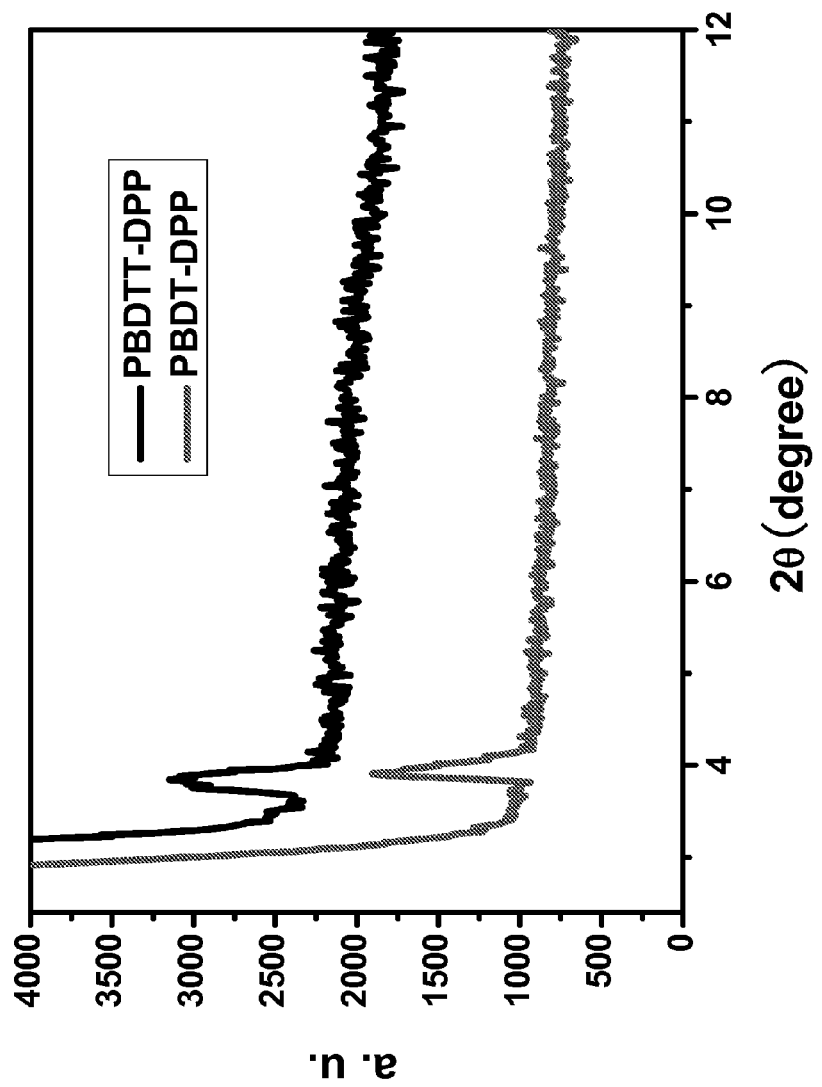
FIG. 14 shows X-ray diffraction profiles of PBDTT-DPP and PBDT-DPP.

The molecular weights (M$_n$) of the polymers were measured by gel permeation chromatography (GPC). The highest M$_n$ of PBDTT-DPP was found to be 40.7 kDa, and 8.5 kDa for PBDT-DPP. This is due to the poor solubility of PBDT-DPP, which precipitates during polymerization before the molecular weight reaches a high value. The hole mobilities of PBDT-DPP and PBDTT-DPP were determined by applying the space charge limited current (SCLC) model to J-V measurements of devices with the structure: ITO/PEDOT:PSS (40 nm)/polymer (100 nm)/Au (70 nm), which is widely used for conjugated polymer systems (ITO=indium tin oxide, PEDOT=poly(3,4-ethylenedioxy-thiophene), PSS=polystyrene sulfonic acid). (See SI) (Shrotriya et al., *Appl. Phys. Lett.*, vol. 89, p. 063505, 2006). FIG. 13 shows the J$^{0.5}$-V plots of the SCLC model. A much higher injection current was observed for PBDTT-DPP than PBDT-DPP under the same conditions. The hole mobilites were found to be $3.1 \times 10^{-4}$ cm$^2$V$^{-1}$s$^{-1}$ and $6.6 \times 10^{-5}$ cm$^2$V$^{-1}$s$^{-1}$ for PBDTT-DPP and PBDT-DPP, respectively. Since the intermolecular packing distance is similar for PBDTT-DPP and PBDT-DPP as indicated by X-ray diffraction (XRD) studies (FIG. 14), the higher hole mobility for PBDTT-DPP is mainly due to the higher molecular weight.

Device Fabrication:

PBDTT-DPP based regular single cell: PBDTT-DPP was co-dissolved with PC$_{71}$BM in 1,2-dichlorobenzene (DCB) in the weight ratio of 1:2, respectively with a concentration of 8 mg/mL. Mixed solvent with about 2% (volume) 1,8-diiodooctance, thermal annealing at 110° C. and solvent annealing also used to further improve the final device performances. ITO-coated glass substrates (15 Ω/cm$^2$) were cleaned stepwise in detergent, water, acetone, and isopropyl alcohol under ultrasonication for 15 min each and subsequently dried in an oven for 5 h. A thin layer (~30 nm) of PEDOT:PSS (Baytron P VP A1 4083) was spin-coated onto ITO surface which was pretreated by ultraviolet ozone for 15 min. Low-conductivity PEDOT:PSS was chosen to minimize measurement error from device area due to lateral conductivity of PEDOT:PSS. After being baked at 120° C. for ~20 min, the substrates were transferred into a nitrogen-filled glove box (<0.1 ppm O$_2$ and H$_2$O). A polymer/PC$_{71}$BM composites layer (ca.100 nm thick) was then spin-cast from the blend solutions at 2500 rpm on the ITO/PEDOT:PSS substrate without further special treatments. Then the film was transferred into a thermal evaporator which is located in the same glovebox. A Ca layer (20 nm) and an Al layer (100 nm) were deposited in sequence under the vacuum of $2 \times 10^{-6}$ torr. The effective area of film was measured to be 0.10 cm$^2$.

P3HT:ICBA based inverted single cell: P3HT was co-dissolved with ICBA in 1,2-dichlorobenzene (DCB) in the weight ratio of 1:1, respectively with a concentration of 18 mg/mL. A thin layer (~30 nm) of ZnO nanoparticles was spin-coated onto ITO surface, and then baked at 120° C. for ~10 min. A P3HT:ICBA layer was then spin-coated from the blend solutions at 800 rpm on the ITO/ZnO substrate, and slow growth in a petri dish and then annealing at 150° C. for 10 min.[1] Then PEDOT:PSS film was spin-coated on P3HT:ICBA surface, finally, the film was transferred into a thermal evaporator chamber for Al evaporation with the thickness of 100 nm. The effective area of film was measured to be 0.10 cm$^2$.

PBDTT-DPP:PC$_{71}$BM based inverted single cell: PBDTT-DPP was co-dissolved with PC$_{71}$BM in 1,2-dichlorobenzene (DCB) in the weight ratio of 1:2, respectively with a concentration of 8 mg/mL. A thin layer (~30 nm) of ZnO nanoparticles was spin-coated onto ITO surface, and then baked at 120° C. for ~10 min. A PBDTT-DPP:PC$_{71}$BM layer was then spin-coated from the blend solutions at 2500 rpm on the ITO/ZnO substrate without further processing. Then the film was transferred into a thermal evaporator chamber for MoO$_3$/Ag evaporation with the thickness of 15/100 nm. The effective area of film was measured to be 0.10 cm$^2$.

Inverted tandem cells: The device architecture of the tandem solar cell is shown in FIG. 9B. The pre-cleaned ITO substrates were treated with UV-ozone. The P3HT:ICBA at a 1:1 weight ratio in 1.8% DCB solution was spin-casted at 800 rpm for 30 s on top of a layer of ZnO. The Films were annealed at 150° C. for 10 min. PEDOT:PSS was spin-coated on first active layer, and annealing at 150° C. for 10 min. After that, a thin layer of ZnO film was spin-casted, followed by thermal annealing at 150° C. for 10 min. After PBDTT-DPP:PC$_{71}$BM (1:2) from 0.8% DCB solution was spin-coated without any processing. The device fabrication was completed by thermal evaporation of 15 nm MoO$_3$ and 100 nm Al as the anode under vacuum at a base pressure of $2 \times 10^{-6}$ Torr. The effective area of film was measured to be 0.10 cm$^2$.

Device Characterization: The fabricated device was encapsulated in a nitrogen-filled glovebox by UV epoxy and cover glass. The current density-voltage (J-V) curves were measured using a Keithley 2400 source-measure unit. The photocurrent was measured under AM 1.5 G illumination at 100 mW/cm$^2$ under the Newport Thermal Oriel 91192 1000W solar simulator (4 in.×4 in. beam size). The light intensity was determined by a monosilicon detector (with KG-5 visible color filter) calibrated by National Renewable Energy Laboratory (NREL) to minimize spectral mismatch. External quantum efficiencies (EQEs) were measured using a lock-in amplifier (SR830, Stanford Research Systems) with current preamplifier (SR570, Stanford Research Systems) under short-circuit conditions. The devices were illuminated by monochromatic light from a xenon lamp passing through a monochromator (SpectraPro-2150i, Acton Research Corporation) with a typical intensity of 10 µW. Prior to incident on the device, the monochromic incident beam is chopped with a mechanical chopper connected to the lock-in amplifier and then focused on the testing pixel of the device. The photocurrent signal is then amplified by SR570 and detected with SR830. A calibrated mono silicon diode with known spectral response is used as a reference.

Figure 10:
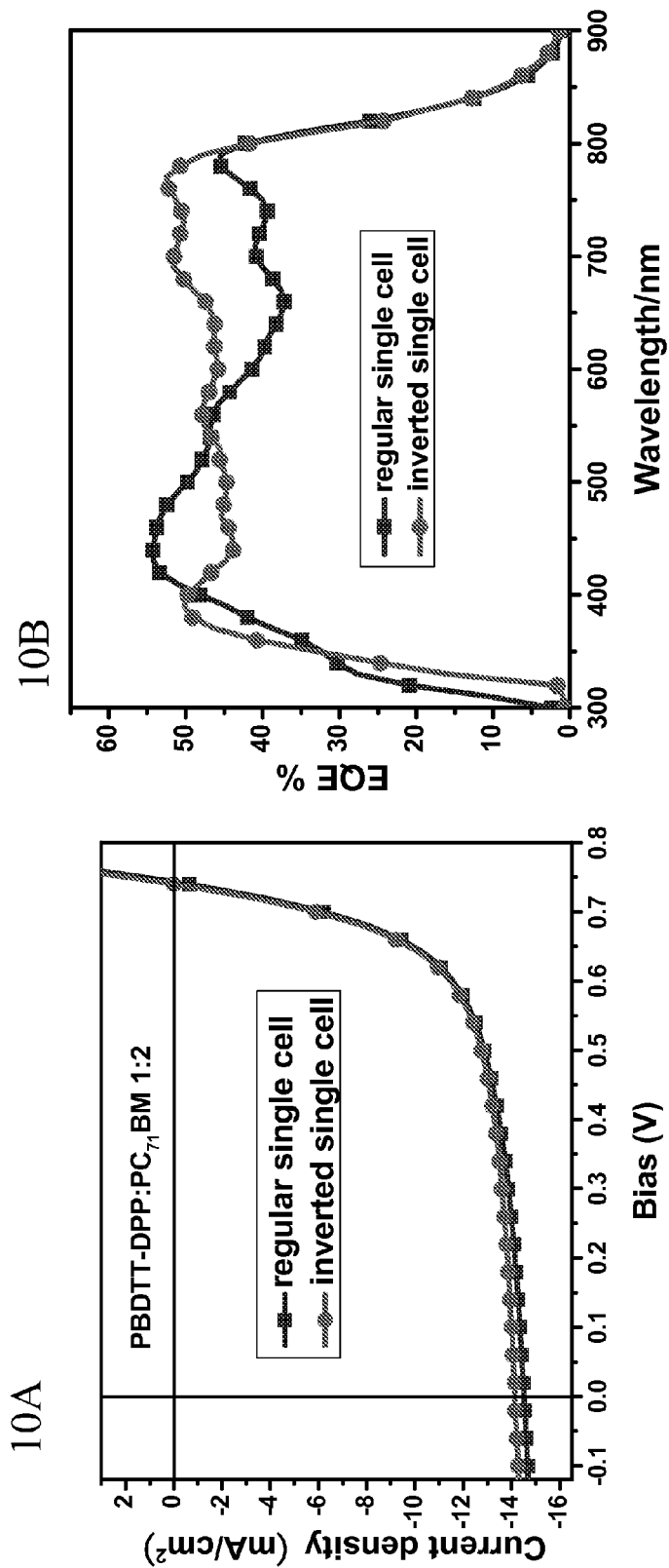
FIG. 10 shows characteristics of single cell devices with regular and inverted structures.

Single layer BHJ photovoltaic cells based on PBDTT-DPP blending with PC$_{71}$BM were fabricated with a regular configuration of ITO/PEDOT:PSS (40 nm)/PBDTT-DPP:PC$_{71}$BM (1:2 w/w, 100 nm)/Ca (20 nm)/Al (100 nm) and an inverted configuration of ITO/ZnO (40 nm)/PBDTT-DPP:PC$_{71}$BM (1:2 w/w, 100 nm)/MoO$_3$ (15 nm)/Ag (100 nm). The polymer active layers were spin-coated from a DCB solution onto prefabricated ITO-sputtered glass substrates. The single cells photovoltaic performance of PBDTT-DPP is shown in FIG. 10A. The best regular device gave a $V_{oc}$ of 0.743 V, a $J_{sc}$ of 14.5 mA/cm$^2$, a fill factor of 65% and a PCE of 7.0% and the best inverted device gave a $V_{oc}$ of 0.742 V, a $J_{sc}$ of 14.2 mA/cm$^2$, a fill factor of 66% and a PCE of 7.0%. For comparison, the parameters for PBDTT-DPP based regular PSC were 2.5% PCE with a $V_{oc}$ of 0.68 V, a $J_{sc}$ of 8.4 mA/cm$^2$ and a fill factor of 44% (Huo et al., *Macromolecules*, vol. 42, p. 6564, 2009). All of the parameters that determine the overall performance were dramatically higher than PBDT-DPP. The increase in the $V_{OC}$ can be attribute to the deeper HOMO level and the enhancement of the $J_{SC}$ and FF is related to the higher hole mobility of PBDTT-DPP. FIG. 11B shows the EQE of the corresponding devices, which exhibited very broad response range covering 350 nm to 850 nm with average EQE of 47% within this region and the integrated $J_{SC}$ from the EQE data were within 5% difference with the measured data. These results indicate that these LBG polymer are successful in achieving high performance while maintaining a small bandgap.

Figure 15:
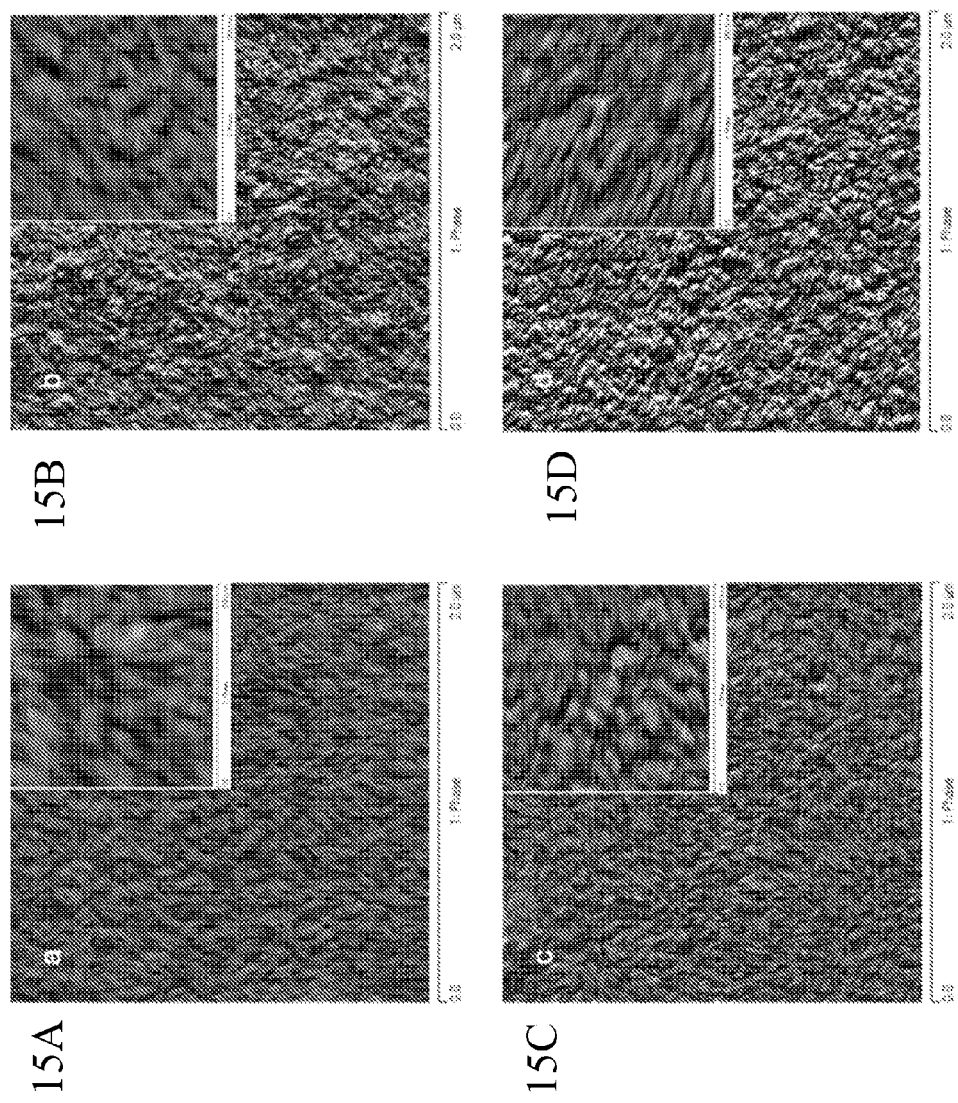
FIG. 15 shows AFM phase images of PBDTT-DPP:PC$_{71}$BM based single cell devices under different treatments.
Figure 16:
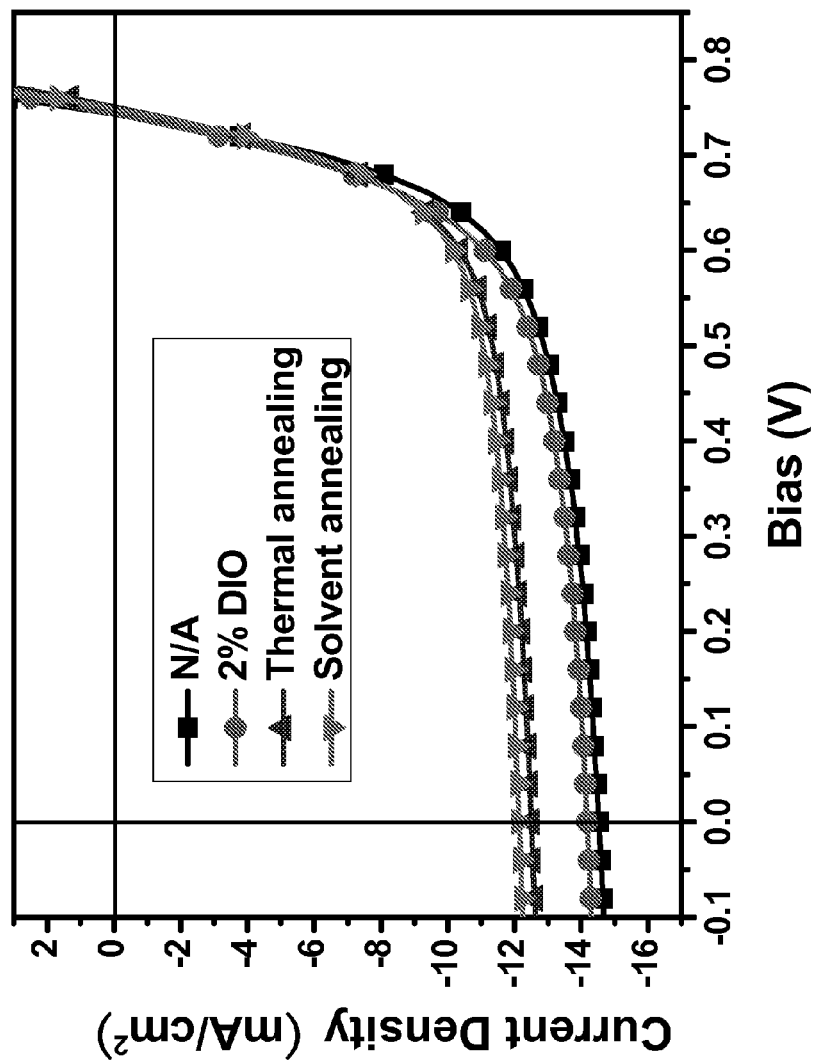
FIG. 16 shows current density-voltage (J-V) characteristics of PBDTT-DPP:PC$_{71}$BM based polymer solar cell with a structure of ITO/PEDOT:PSS/PBDTT-DPP: PC$_{71}$BM/Ca/Al with no further treatment, after treatment with 2% DIO in dichlorobenzene, after annealing at 110° C. for 15 min, and after solvent annealing.

To further enhance the photovoltaic performance by adjusting the phase separation between PBDTT-DPP and PCBM, thermal annealing (Padinger et al., *Adv. Funct. Mater.*, vol. 13, p. 85, 2003), solvent annealing (Li et al., *Nat. Mater.*, vol. 4, p. 864, 2005) and using additives (such as diiodoctane, DIO) (Peet et al., *Nat. Mater.*, vol. 6, p. 497, 2007) during device fabrication were performed. However, none of these treatments enhanced the PCE of devices fabricated from the PBDTT-DPP:PC$_{71}$BM blend films. This implies the phase separation in the PBDTT-DPP:PC$_{71}$BM blend already achieved the subtle balance required to form a nano-scale bi-continuous phase as cast from pure DCB. Representative characteristics of the solar cells are summarized in Table 1. To further investigate the details of the morphology of the devices under different conditions, atomic force microscopy (AFM) phase images were taken. FIG. 15 shows the AFM phase images of PBDTT-DPP:PC$_{71}$BM based polymer solar cells under different treatments. Without any further treatment, the polymer:PC$_{71}$BM blends can achieve a fine phase separation on the nano-scale; after using DIO as an additive with thermal annealing and solvent annealing, slightly coarser morphologies were obtained, which led to slightly lower J$_{SC}$ for the devices (Padinger et al., *Adv. Funct. Mater.*, vol. 13, p. 85, 2003; Li et al., *Nat. Mater.*, vol. 4, p. 864, 2005; Peet et al., *Nat. Mater.*, vol. 6, p. 497, 2007. With the optimized device fabrication condition, more than 100 devices were fabricated, and around 90% showed over 6.6% PCE with an average of 6.8%, indicating good reproducibility for the devices based on this material. The simple process and good reproducibility of the solar cell devices based on PBDTT-DPP show high potential for industrial applications.

TABLE 1

PBDTT-DPP based single solar cell performance under different treatments.

| Treatment | V$_{OC}$ (V) | J$_{SC}$ (mA/cm$^2$) | FF (%) | PCE$_{best}$ (%) | PCE$_{average}$ (%) |
|---|---|---|---|---|---|
| N/A | 0.743 | 14.5 | 65 | 7.0 | 6.7 |
| A[a] | 0.743 | 14.4 | 64 | 6.9 | 6.6 |
| T[b] | 0.751 | 12.5 | 66 | 6.2 | 6.0 |
| S[c] | 0.749 | 12.1 | 67 | 6.1 | 5.7 |

[a]Additive: Diiodoctane (DIO, 2% volume in dichlorobenzene).
[b]Thermal annealing: 110° C., 15 min.
[c]Solvent annealing.

With the LBG material, a detailed study on the tandem PSCs based on PBDTT-DPP was carried out. In the tandem structure, P3HT: Indene-C$_{60}$ Bisadduct (IC$_{60}$BA) (He et al., *J. Am. Chem. Soc.*, vol. 132, p. 1377, 2010) was selected as the front cell materials, because the new acceptor could enhance the device V$_{OC}$ significantly and maintain the J$_{SC}$ and FF. The acceptor for PBDTT-DPP was PC$_{71}$BM. The corresponding chemical structures are shown in FIG. 11A. The inverted tandem structure was chosen in this study because of the simplicity of device fabrication and better stability (Chou et al., *Adv. Mater.*, vol. 23, p. 1282, 2011). The inverted device structure and the corresponding energy diagram are shown in FIGS. 11B and 11C. ZnO was used as the electron transporting layer due to the proper LUMO level and high electron mobility (Chou et al., *Adv. Mater.*, vol. 23, p. 1282, 2011); PEDOT:PSS was used as the hole transporting layer for P3HT and MoO$_3$ was used for PBDTT-DPP due to the proper HOMO levels and high hole mobility (Sista et al., *Adv. Mater.*, vol. 22, p. 380, 2010; Chou et al., *Adv. Mater.*, vol. 23, p. 1282, 2011). Thus, the energy difference between different layers was minimized to ensure good charge transport. Furthermore, due to the inherent advantages of the inverted structure, Ag can be used as the top electrode to avoid oxidation problems associated with the Al electrode when used in the regular structure.

Inverted tandem solar cells were fabricated using the LBG polymer PBDTT-DPP and device architecture. The J-V characteristics and the performance parameters of the best device are shown in FIG. 11D and Table 2, respectively. The best device showed a high performance with PCE as high as 9.5%. The overall V$_{OC}$ added up from two sub-cells perfectly to give 1.56 V. Additionally, the FF reached 67% for the tandem cell, which was comparable with both sub-cells. A high J$_{SC}$ of 9.1 mA/cm$^2$ was obtained, which means the front cell and the rear cell matched with each other very well with both of them able to provide at least 9.1 mA/cm$^2$ of photocurrent. The series resistance of the device was only 2.12 ohm·cm$^2$, which is low enough for efficient charge transport between different layers. These parameters indicate that good contact was obtained between different functional layers in the inverted tandem structure, demonstrating the great potential of PBDTT-DPP for tandem cells. Moreover, the inverted device shows excellent stability and reproducibility, with an average PCE among 100 devices of 9.3%. The devices maintain about 90% of its original performance after encapsulation for 30 days (stored in a glovebox) as shown in FIG. 11E. With the improved device architecture and surface engineering, as well as light management using an anti-reflective coating to further improve the J$_{SC}$, over 10% PCE may be expected from the tandem device in the near future.

A high performance LBG conjugated polymer for tandem PSCs has been demonstrated. The polymer (PBDTT-DPP) has a small optical bandgap, deep HOMO level and high hole mobility. Single layer BHJ solar cells fabricated from PBDTT-DPP and PC$_{71}$BM exhibit PCEs reaching 7%. In inverted tandem PSCs, PBDTT-DPP as the rear cell active material achieved PCEs as high as 9.5%, which is the highest published efficiency for organic photovoltaic devices to date. 10% tandem PSC may soon be achieved by optimizing the ICLs and adding an anti-reflective coating to further increase the J$_{SC}$. This study opens up a new direction for polymer chemists to design new materials for tandem PSCs and also makes an important step forward toward commercialization of PSCs.

TABLE 2

Inverted Tandem Solar Cells Paramters.

| | V$_{OC}$ (V) | J$_{SC}$ (mA/cm$^2$) | FF (%) | PCE$_{best}$ | PCS$_{average}$ |
|---|---|---|---|---|---|
| Front cell | 0.85 | 9.76 | 69.5 | 5.8% | — |
| Rear cell | 0.74 | 13.6 | 65.6 | 6.6% | — |
| Tandem | 1.56 | 9.10 | 67.1 | 9.5% | 9.3% |
| Tandem (Ref[a]) | 1.20-1.58 | 6.00-7.84 | 52.0-67.0 | 4.9-6.5% | — |

[a]Ref: reported data in Kim et al., *Science*, vol. 317, p. 222, 2007; Gilot et al., *Adv. Mater.*, vol. 22, p. E67, 2010; Sista et al., *Adv. Mater.*, vol. 22, p. 380, 2010; Chou et al., *Adv. Mater.* Vol. 23, p. 1282, 2011.

The current invention was described with reference to particular embodiments and examples. However, this invention is not limited to only the embodiments and examples described. One of ordinary skill in the art should recognize, based on the teachings herein, that numerous modifications and substitutions can be made without departing from the scope of the invention which is defined by the claims.

As described herein, all embodiments or subcombinations may be used in combination with all other embodiments or subcombinations, unless mutually exclusive.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. An inverted tandem polymer photovoltaic device, comprising:
   a hole-extracting electrode;
   an electron extracting electrode spaced apart from said hole-extracting electrode;
   a first bulk hetero-junction polymer semiconductor layer;
   a second bulk hetero-junction polymer semiconductor layer spaced apart from said first bulk hetero-junction polymer semiconductor layer; and
   between said first and second bulk hetero-junction polymer semiconductor layers, a p-type layer in physical contact with one of the first and second bulk hetero-junction polymer semicondutor layers, and an n-type layer in physical contact with the other of the first and second bulk hetero-junction polymer semiconductor layer;
   wherein at least one of the p-type layer and the n-type layer is doped to an extent that charge carriers tunnel through the p-type and/or n-type layer, and wherein one polymer used in either the first or second bulk hetero-junction polymer semiconductor layers has a structure of formula (I)

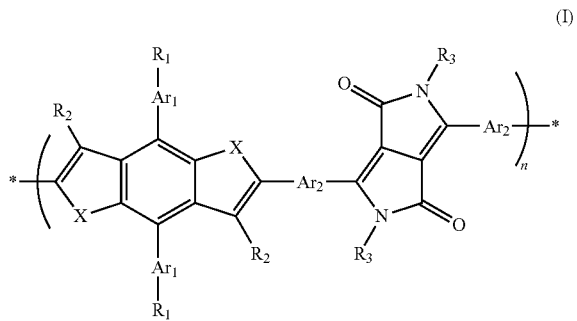

wherein $R_1$, $R_2$, and $R_3$ are independently selected from alkyl groups with up to 18 carbon atoms, aryls and substituted aryls;
X is selected from oxygen, sulfur, selenium and nitrogen atoms; and
$Ar_1$ and $Ar_2$ are each, independently, one to five monocyclic arylene, bicyclic arylene, and polycyclic arylene, monocyclic heteroarylene, bicyclic heteroarylene and polycyclic heteroarylene groups, either fused or linked.

2. A tandem polymer photovoltaic device according to claim 1, wherein said electron-extracting electrode is transparent.

3. A tandem polymer photovoltaic device according to claim 1, wherein said p-type layer is closer to the electron-extracting electrode than said n-type layer.

4. A tandem polymer photovoltaic device according to claim 1, wherein said p-type layer is in physical contact with said n-type layer.

5. A tandem polymer photovoltaic device according to claim 1, wherein said p-type layer is doped to an extent that holes tunnel through the doped p-type layer.

6. The tandem polymer photovoltaic device according to claim 5, wherein the p-type layer is doped with poly(styrene sulfonic acid), $FeCl_3$, $I_2$, or $H_2O_2$.

7. A tandem polymer photovoltaic device according to claim 1, wherein said n-type layer is doped to an extent that electrons tunnel through the doped n-type layer.

8. The tandem polymer photovoltaic device according to claim 7, whereins said n-type layer is doped with a low work function metal, Na, Li, Al, a low work function fluorides, LiF, CsF, a low work function salts, or $Cs_2CO_3$.

9. A tandem polymer photovoltaic device according to claim 1, wherein said p-type layer and said n-type layer both are doped to an extent that charge carriers tunnel through both doped layers.

10. A tandem polymer photovoltaic device according to claim 1, wherein said n-type layer is comprises an n-type metal oxide.

11. A tandem polymer photovoltaic device according to claim 8, wherein said n-type metal oxide is selected from the group consisting of ZnO, ZnOx, TiO2, TiOx and combinations thereof.

12. A tandem polymer photovoltaic device according to claim 1, wherein said p-type comprises a p-type metal oxide.

13. A tandem polymer photovoltaic device according to claim 1, wherein said p-type metal oxide is selected from the group consisting of $MoO_3$, MoOx, $V_2O_5$, VOx, WO3, WOx, NiO, NiOx, graphene oxide, and combinations thereof.

14. A tandem polymer photovoltaic device according to claim 1, wherein said p-type layer is a p-type polymer layer.

15. A tandem polymer photovoltaic device according to claim 1, wherein said p-type layer is PEDOT doped with poly(styrenesulfonic acid).

16. A tandem polymer photovoltaic device according to claim 1, wherein said n-type layer is ZnO.

17. The tandem polymer photovoltaic device according to claim 1 further comprising an electron transporting layer between the electron extracting electrode and the first bulk hetero-junction polymer semiconductor layer or second bulk hetero-junction polymer semiconductor layer.

18. The tandem polymer photovoltaic device according to claim 1 further comprising a hole transporting layer between the hole extracting electrode and the first bulk hetero-junction polymer semiconductor layer or second bulk hetero-junction polymer semiconductor layer.

19. The tandem polymer photovoltaic device according to claim 1, wherein the first bulk hetero-junction polymer semiconductor layer is closer to the electron extracting electrode than the second bulk hetero-junction polymer semiconductor layer.

20. The tandem polymer photovoltaic device according to claim 19, wherein the polymer used in the first bulk hetero-junction polymer semiconductor layer has a wider bandgap than the polymer used in the second bulk hetero-junction polymer semiconductor layer.

21. The tandem polymer photovoltaic device according to claim 20, wherein the polymer used in the first bulk hetero-junction polymer semiconductor layer has an absorbance maximum between about 400 nm and about 700 nm and the polymer used in the second bulk hetero-junction polymer semiconductor layer as an absorbance maximum between 700 nm and about 1000 nm.

22. The tandem polymer photovoltaic device according to claim 20, wherein the absorbance maximum of the polymer used in the first bulk hetero-junction polymer semiconductor layer is more than 20 nm shorter than the absorbance maximum of the polymer used in the second bulk hetero-junction polymer semiconductor layer.

23. The tandem polymer photovoltaic device according to claim 20, wherein the wavelength of the trailing edge at 60% of the maximum absorbance of the absorbance spectrum between 300 nm and 1000 nm of the polymer used in the first bulk hetero-junction polymer semiconductor layer is shorter than or equal to the wavelength of the leading edge at 60% of the maximum absorbance the absorbance spectrum between 300 nm and 1000 nm of the polymer used in the second bulk hetero-junction polymer semiconductor layer.

24. The tandem polymer photovoltaic device according to claim 20, wherein the absorbance at the wavelength halfway between the absorbance maximum of the polymer used in the first bulk hetero-junction polymer semiconductor layer and the absorbance maximum of the polymer used in the second bulk hetero-junction polymer semiconductor layer in the sum of the normalized absorbance spectra measured between 300 nm and 1000 nm is greater than 10% and less than 150% of the normalized maximum absorbance of either polymer individually.

* * * * *